US009936823B2

(12) United States Patent
Galant

(10) Patent No.: US 9,936,823 B2
(45) Date of Patent: Apr. 10, 2018

(54) SECURITY SYSTEM FOR DISPLAYING OBJECTS

(71) Applicant: Compucage International Inc., Kleinburg (CA)

(72) Inventor: Steve N. Galant, Kleinburg (CA)

(73) Assignee: Compucage International Inc. (CA)

( * ) Notice: Subject to any disclaimer, the term of this patent is extended or adjusted under 35 U.S.C. 154(b) by 55 days.

(21) Appl. No.: 14/443,813

(22) PCT Filed: Nov. 22, 2013

(86) PCT No.: PCT/CA2013/050895
§ 371 (c)(1),
(2) Date: May 19, 2015

(87) PCT Pub. No.: WO2014/078966
PCT Pub. Date: May 30, 2014

(65) Prior Publication Data
US 2015/0305518 A1 Oct. 29, 2015

Related U.S. Application Data

(60) Provisional application No. 61/729,497, filed on Nov. 23, 2012.

(51) Int. Cl.
*A47F 3/00* (2006.01)
*F16M 11/04* (2006.01)
(Continued)

(52) U.S. Cl.
CPC ............ *A47F 3/002* (2013.01); *A47F 7/024* (2013.01); *A47F 7/0246* (2013.01);
(Continued)

(58) Field of Classification Search
CPC .. E05B 73/0082; E05B 73/0005; E05B 73/00; E05B 65/00; E05B 73/0017;
(Continued)

(56) References Cited

U.S. PATENT DOCUMENTS 1,402,621 A * 1/1922 Knittel ................... B25B 5/142
269/156
2,610,661 A * 9/1952 Romine .................. B25B 5/101
269/156
(Continued)

FOREIGN PATENT DOCUMENTS

CN 2624540 Y 7/2004
CN 201839332 U 5/2011
(Continued)

OTHER PUBLICATIONS

"Security Devices for Retail Electronics Displays/The Scorpion"; Scorpion Security Products;web pp. 1-4; http://scorpionsecurityproducts.com/features/;Nov. 21, 2012.
(Continued)

*Primary Examiner* — Stanton L Krycinski
*Assistant Examiner* — Taylor L Morris
(74) *Attorney, Agent, or Firm* — Dureska & Moore, LLC; David P. Dureska; David J. Danko

(57) ABSTRACT

A mount assembly and a security system for securely displaying objects. A mount assembly for securing to an object, including opposed clamp members for engaging the object, and a clamp assembly for releasably securing the clamp members, the clamp assembly including opposed surfaces defining at least one passage for receiving ends of the opposed clamp members, the opposed surfaces being movable to each other to secure the clamp members.

13 Claims, 21 Drawing Sheets

(51) Int. Cl.
*A47F 7/024* (2006.01)
*G08B 13/14* (2006.01)
*F16M 11/06* (2006.01)
*E05B 73/00* (2006.01)
*F16M 11/20* (2006.01)
*F16M 13/02* (2006.01)
*F16M 13/00* (2006.01)
*F16M 11/08* (2006.01)
*E05B 65/00* (2006.01)
*H05K 5/02* (2006.01)
*F16B 2/06* (2006.01)
*F16B 2/12* (2006.01)
*F16M 11/24* (2006.01)

(52) U.S. Cl.
CPC ....... *E05B 73/0082* (2013.01); *F16M 11/041* (2013.01); *F16M 11/06* (2013.01); *F16M 11/08* (2013.01); *F16M 11/2092* (2013.01); *F16M 13/00* (2013.01); *F16M 13/02* (2013.01); *G08B 13/1409* (2013.01); *A47F 3/004* (2013.01); *E05B 65/00* (2013.01); *E05B 73/0005* (2013.01); *F16B 2/065* (2013.01); *F16B 2/12* (2013.01); *F16M 11/2014* (2013.01); *F16M 11/24* (2013.01); *F16M 2200/02* (2013.01); *H05K 5/0204* (2013.01)

(58) Field of Classification Search
CPC ...... F16M 11/041; F16M 13/00; F16M 13/02; F16M 2200/02; B60R 11/0241; B60R 11/0252; B60R 2011/0075; B60R 11/02; B60R 11/0258; A47F 7/024; A47F 7/0246; A47F 3/002; A47F 3/004; H04M 1/04
USPC .... 248/222.14, 316.1, 316.4, 413, 551, 553; 269/156, 246; 340/568.1; 379/455; 70/58
See application file for complete search history.

(56) References Cited

U.S. PATENT DOCUMENTS

| | | | | |
|---|---|---|---|---|
| 3,913,880 | A * | 10/1975 | Lucasey | E05B 73/0082 248/415 |
| 4,079,604 | A | 3/1978 | Anderegg | |
| 4,305,266 | A | 12/1981 | Lockwood | |
| 5,060,260 | A * | 10/1991 | O'Connell | B60R 11/0241 224/553 |
| 5,169,114 | A * | 12/1992 | O'Neill | E05B 73/0082 248/316.4 |
| 5,187,744 | A * | 2/1993 | Richter | B60R 11/0241 224/553 |
| 5,457,745 | A * | 10/1995 | Wang | B60R 11/0241 379/426 |
| 5,697,601 | A * | 12/1997 | Gurule | B23B 47/28 269/104 |
| 5,836,563 | A * | 11/1998 | Hsin-Yung | B60R 11/0241 248/316.4 |
| 5,903,645 | A * | 5/1999 | Tsay | B60R 11/0241 248/316.4 |
| 6,119,992 | A * | 9/2000 | Stuart | A47B 57/583 248/228.6 |
| 6,120,088 | A * | 9/2000 | Terranova | B60N 2/4666 108/46 |
| 6,215,870 | B1 * | 4/2001 | Hirai | B60R 11/0241 379/446 |
| 6,279,861 | B1 * | 8/2001 | Nolan | F16M 11/10 248/188.2 |
| 6,285,758 | B1 * | 9/2001 | Lu | B60R 11/0241 379/446 |
| 6,474,614 | B2 * | 11/2002 | MacEachern | F16M 11/10 248/349.1 |
| 6,556,433 | B1 * | 4/2003 | Love | G06F 1/184 312/223.2 |
| 6,700,488 | B1 * | 3/2004 | Leyden | G08B 13/1463 340/568.1 |
| 7,114,714 | B2 * | 10/2006 | Wong | B23K 37/04 269/45 |
| 7,187,283 | B2 | 3/2007 | Leyden et al. | |
| 7,293,751 | B2 * | 11/2007 | Eriksson | A47B 23/002 108/43 |
| 7,299,668 | B1 * | 11/2007 | Lu | E05B 73/0082 70/14 |
| 7,324,333 | B2 * | 1/2008 | Allen | E05B 73/0082 211/8 |
| 7,407,141 | B2 * | 8/2008 | Boulard | B60J 7/104 248/228.5 |
| 7,611,112 | B2 * | 11/2009 | Lin | B60R 11/02 248/274.1 |
| 7,712,720 | B1 * | 5/2010 | Cheng | B60R 11/00 248/205.5 |
| 7,984,886 | B2 * | 7/2011 | Lin | B60R 11/0252 108/44 |
| 7,986,369 | B1 * | 7/2011 | Burns | F16M 11/40 248/187.1 |
| 8,701,452 | B2 * | 4/2014 | Foster | E05B 73/0082 248/316.1 |
| 8,864,089 | B2 * | 10/2014 | Hung | F16M 11/041 248/122.1 |
| 8,985,544 | B1 | 3/2015 | Gulick, Jr. | |
| 9,039,785 | B2 | 5/2015 | Gulick, Jr. | |
| 9,298,219 | B2 | 3/2016 | Gulick, Jr. | |
| 2002/0074705 | A1 * | 6/2002 | Marusiak | B23B 47/287 269/156 |
| 2002/0159587 | A1 | 10/2002 | Chang | |
| 2004/0046662 | A1 | 3/2004 | Leyden et al. | |
| 2005/0206522 | A1 | 9/2005 | Leyden et al. | |
| 2006/0145039 | A1 * | 7/2006 | Shawver | B60R 11/0241 248/309.1 |
| 2007/0197271 | A1 * | 8/2007 | Haikola | B60R 11/0241 455/575.8 |
| 2008/0192410 | A1 * | 8/2008 | Kumar | G06F 1/1632 361/679.4 |
| 2008/0203260 | A1 * | 8/2008 | Carnevali | B60R 11/0241 248/316.5 |
| 2009/0173863 | A1 * | 7/2009 | Crown | B60R 11/0241 248/316.4 |
| 2010/0000447 | A1 * | 1/2010 | Song | A61B 5/00 108/50.11 |
| 2011/0062299 | A1 * | 3/2011 | Tsai | F16M 11/041 248/231.41 |
| 2012/0037783 | A1 * | 2/2012 | Alexander | A47F 7/024 248/551 |
| 2015/0108948 | A1 | 4/2015 | Gulick, Jr. et al. | |
| 2015/0300050 | A1 * | 10/2015 | Van Balen | A47F 7/0246 248/551 |

FOREIGN PATENT DOCUMENTS

| | | |
|---|---|---|
| EP | 1894788 A1 | 3/2008 |
| FR | 2762761 A1 | 11/1998 |
| TW | M415960 U1 | 11/2011 |
| WO | 2012137007 A1 | 10/2012 |
| WO | 20120137007 A1 | 10/2012 |

OTHER PUBLICATIONS

"Mobile Electronic Security and Loss Prevention Device/The Scorpion";Scorpion Security Products;web pp. 1-3;http://scorpionsecurityproducts.com/security-products/mobile/;Nov. 21, 2012.

* cited by examiner

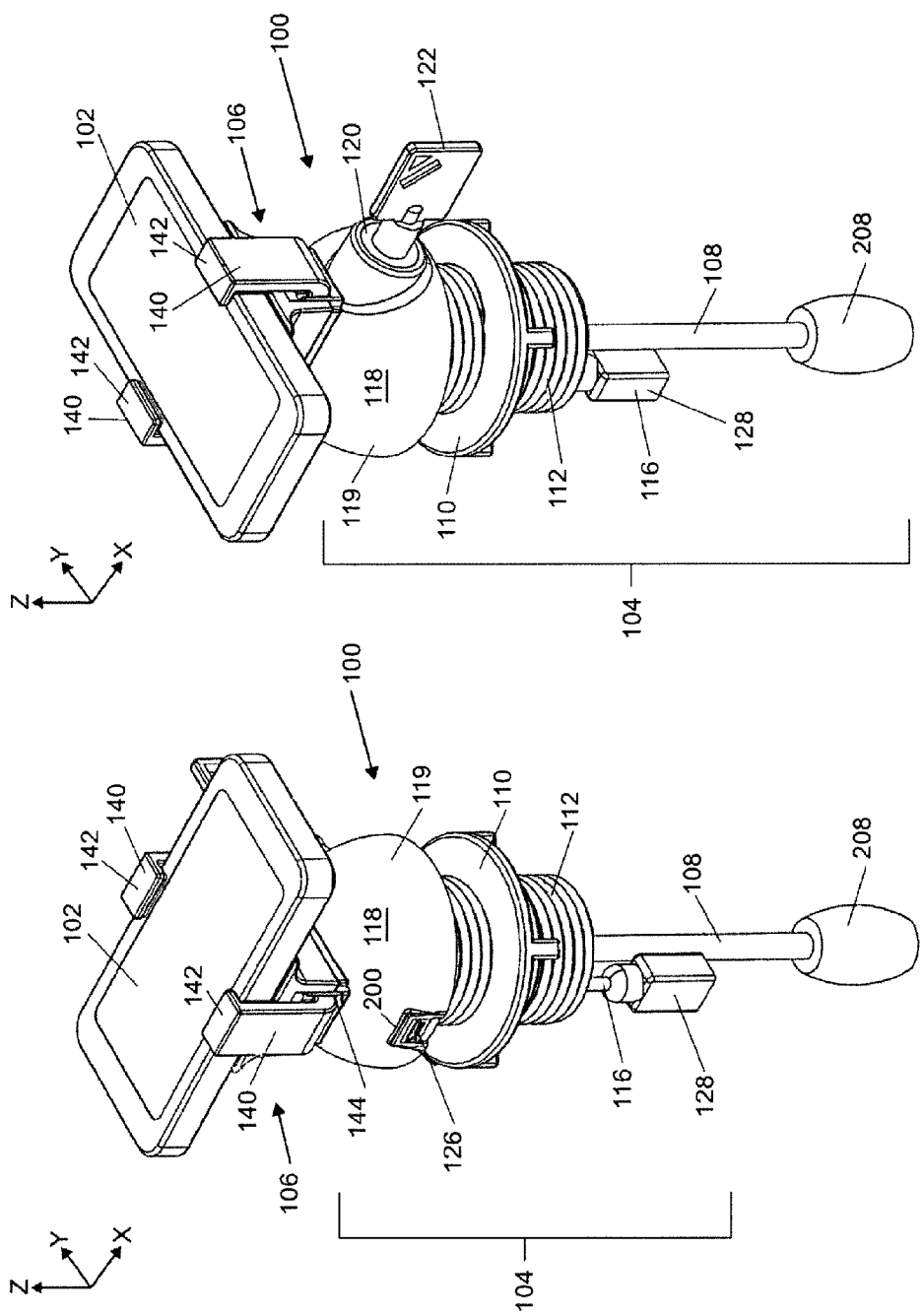

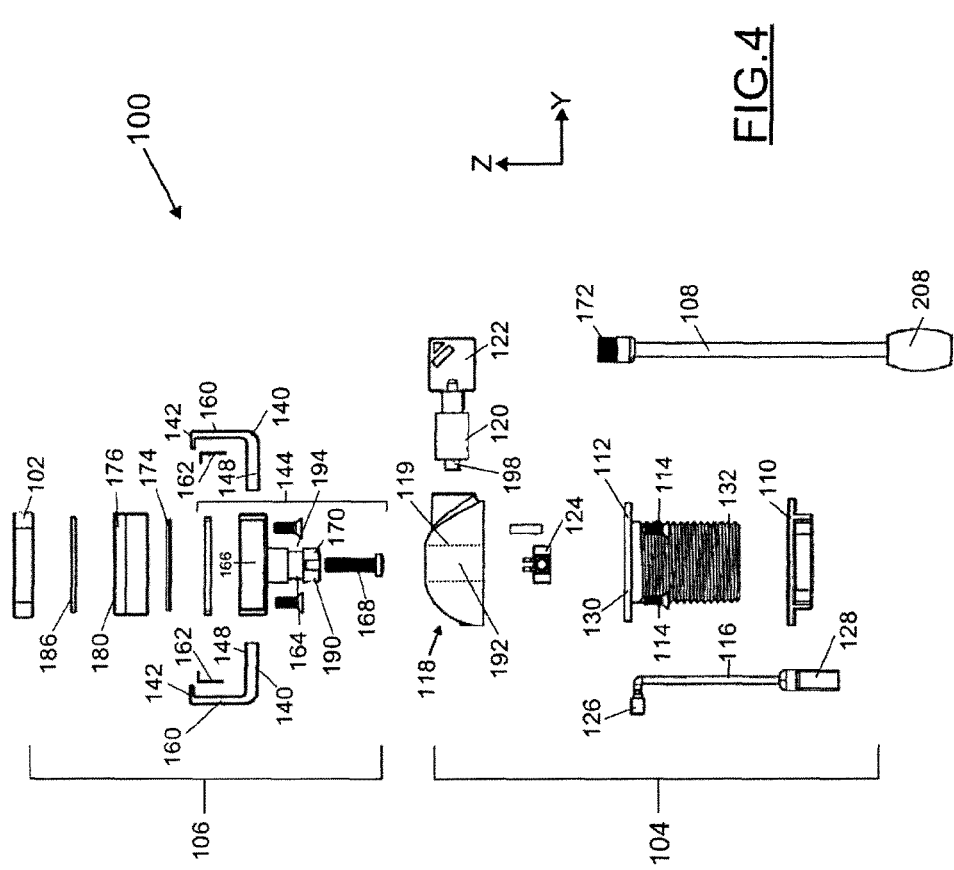

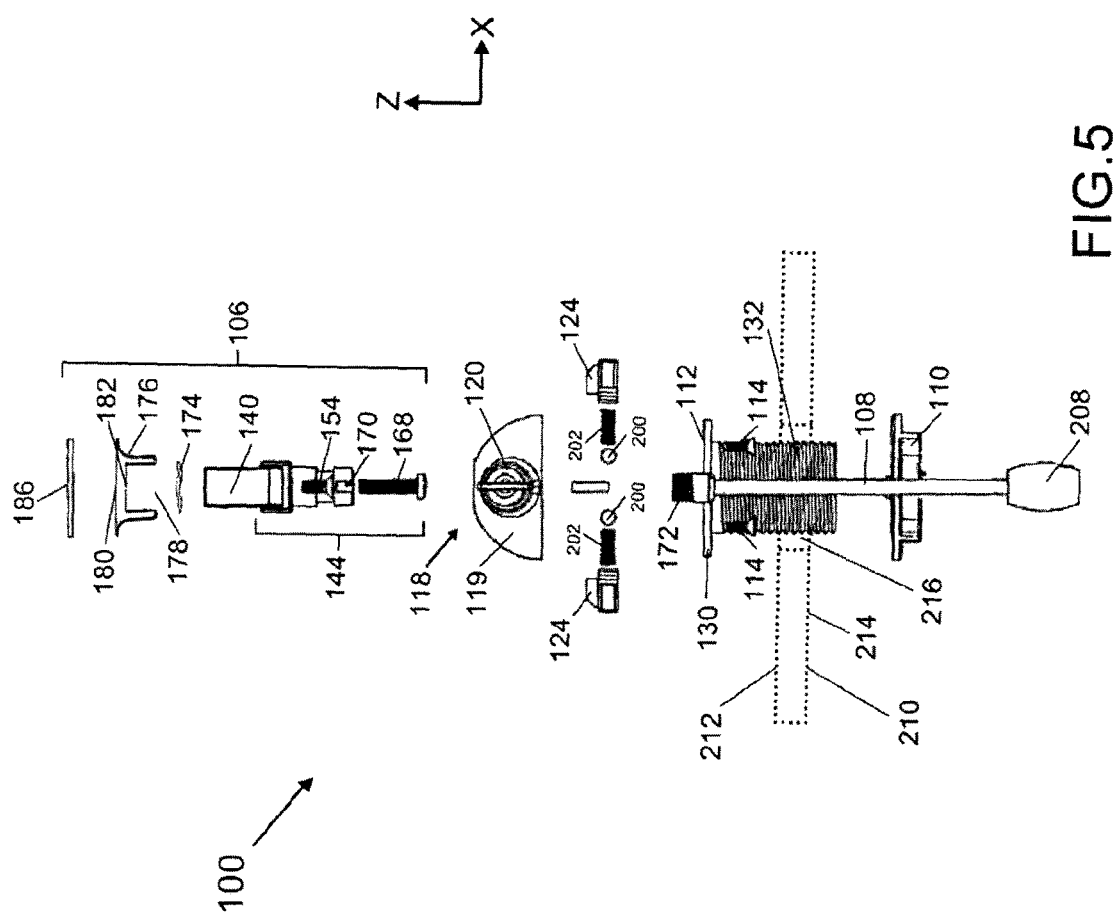

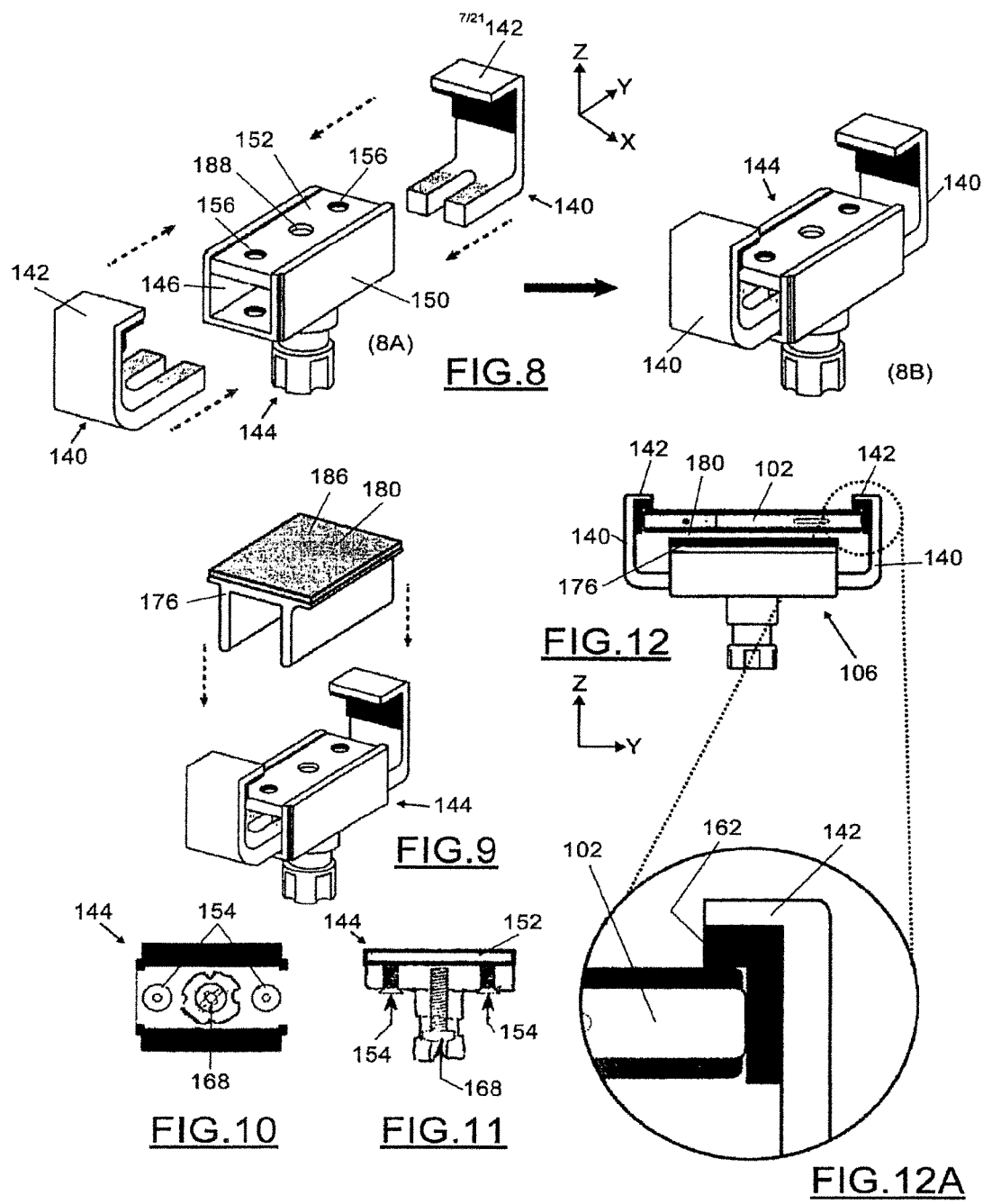

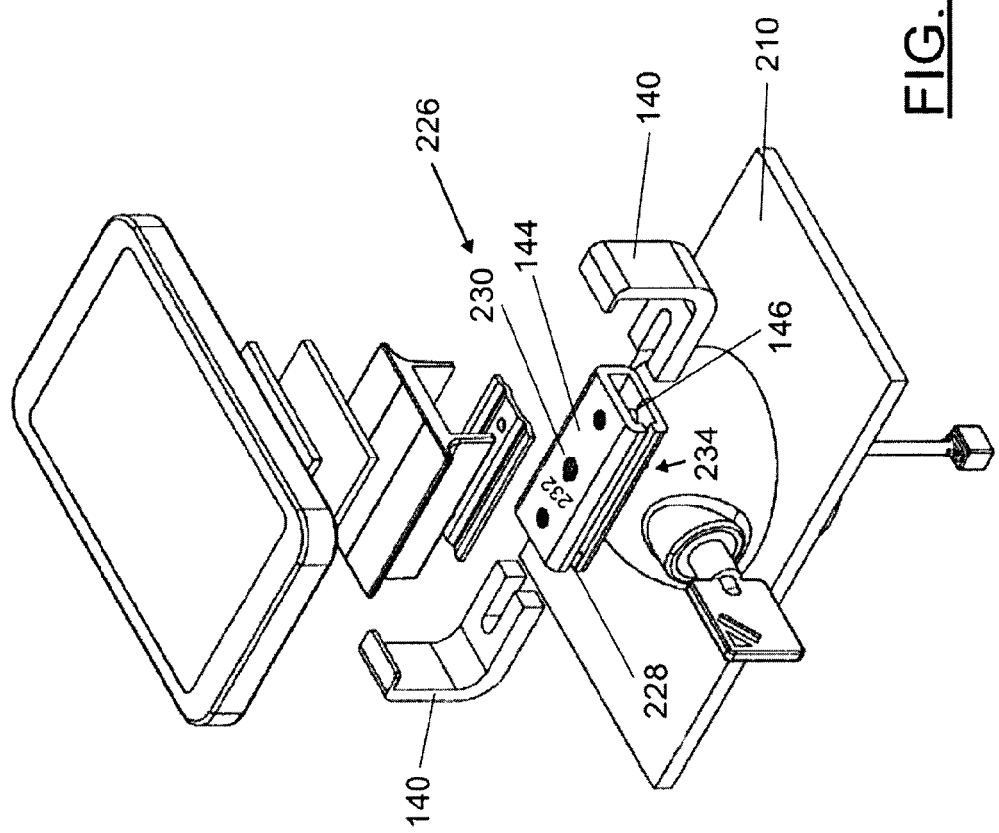

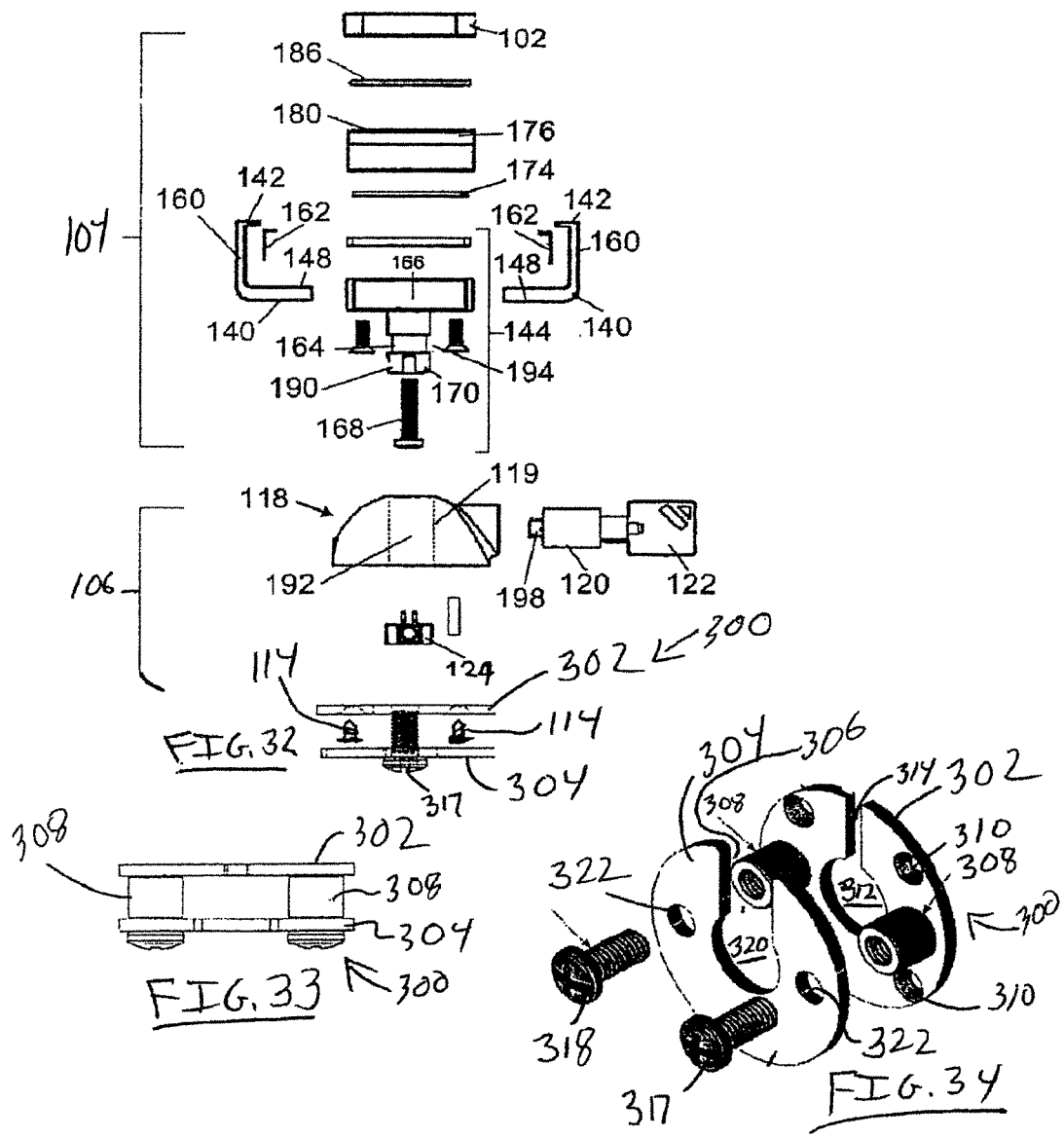

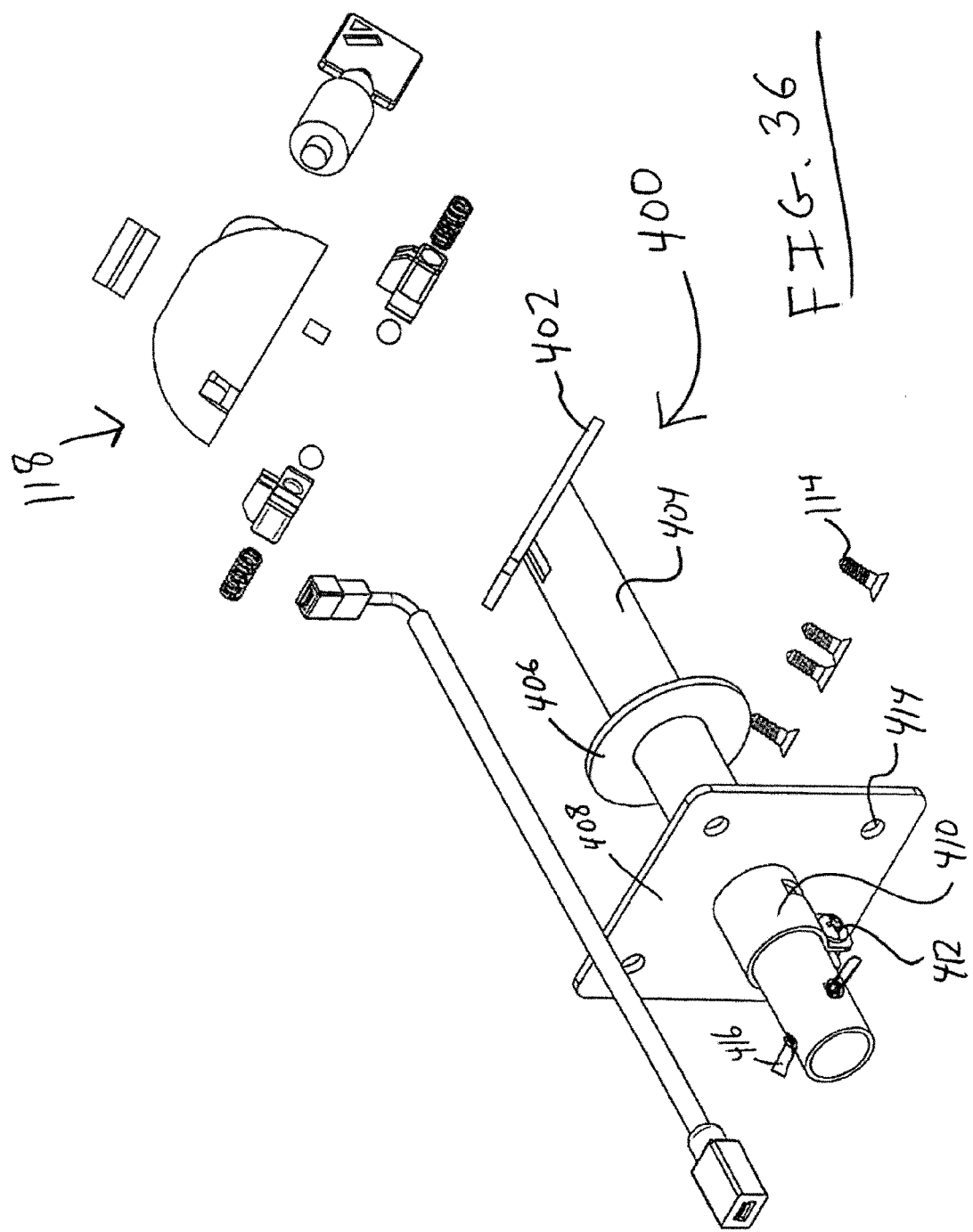

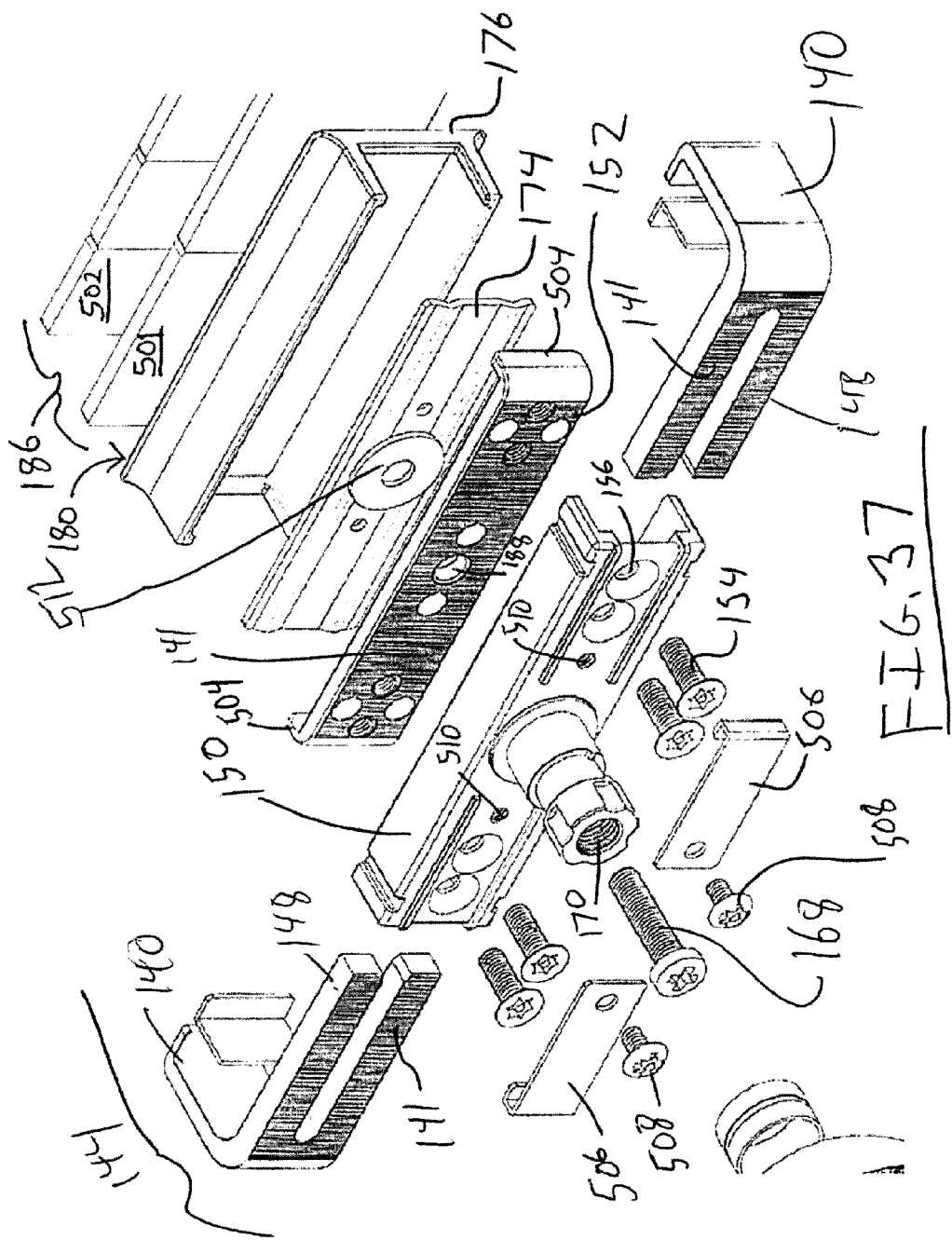

SECURITY SYSTEM FOR DISPLAYING OBJECTS

CROSS-REFERENCE TO RELATED APPLICATION

This application claims the benefit of PCT Application Serial No. PCT/CA2013/050895 filed Nov. 22, 2013, which in turn claims the benefit of U.S. Provisional Patent Application Ser. No. 61/729,497, filed Nov. 23, 2012.

The content of the above patent application is hereby expressly incorporated by reference into the detailed description hereof.

TECHNICAL FIELD

The present disclosure relates generally to a security system for securely displaying objects.

BACKGROUND

A variety of techniques and apparatus have been developed to allow potential purchasers and other individuals to view and interact with objects such as smart phones, tablet computers, GPS receivers, personal media players, personal gaming systems and other electronic devices or high value wares, while at the same time securing such objects against unauthorised removal.

SUMMARY

A mount assembly and a security system for securely displaying objects.

According to one aspect is a mount assembly for securing to an object, comprising opposed clamp members for engaging the object, and a clamp assembly for releasably securing the clamp members, the clamp assembly including opposed surfaces defining a passage for receiving ends of the opposed clamp members, the opposed surfaces being movable to each other to secure the clamp members.

According to another aspect is a security system comprising a mount assembly for securing to an object and an anchor assembly for securing to a support member, the mount assembly being releasably lockable to the anchor assembly, wherein when the mount assembly is locked to the anchor assembly the object cannot be released from the mount assembly.

According to another aspect is a mount assembly for securing to an object, comprising opposed clamp members for engaging the object, a clamp assembly for releasably securing the clamp members, and a clamp member slidabley received on the clamp assembly for engaging a back of the object when the opposed clamp members engage a front of the object.

According to another aspect is a cut resistant cable, comprising: a plurality of conductors, surrounded by an overbraid comprising strands of steel and Kevlar.

BRIEF DESCRIPTION OF THE DRAWINGS

For a better understanding of the invention, and to show how it may be carried into effect, reference will now be made, by way of example, to the accompanying drawings:

FIGS. 1 and 2 are perspective views of a security system according to an example embodiment;

FIG. 4 is an exploded front view of the security system of FIGS. 1 and 2;

FIG. 5 is an exploded side view of the security system of FIGS. 1 and 2;

FIGS. 8 and 9 are perspective views illustrating assembly of the mount assembly of the security system of FIG. 1;

FIG. 10 is a bottom view of a clamp assembly of the mount assembly of the security system of FIG. 1;

FIG. 11 is a schematic side view of the clamp assembly of FIG. 10;

FIG. 12 is an end view of the a mount assembly of the security system of FIG. 1 attached to an object;

FIG. 12A is an enlarged partial view of FIG. 12;

FIG. 18 is an exploded perspective view of a further example embodiment of a security system;

FIG. 32 is an exploded front view of a security system according to another example embodiment;

FIG. 33 is a side view of a mounting system of the security system of FIG. 32;

FIG. 34 is a perspective exploded view of the mounting system of FIG. 33;

FIG. 36 is a perspective exploded view of a further embodiment of a security system;

FIG. 37 is an exploded partial perspective view of a security system according to another example embodiment;

DETAILED DESCRIPTION

Figure 3:
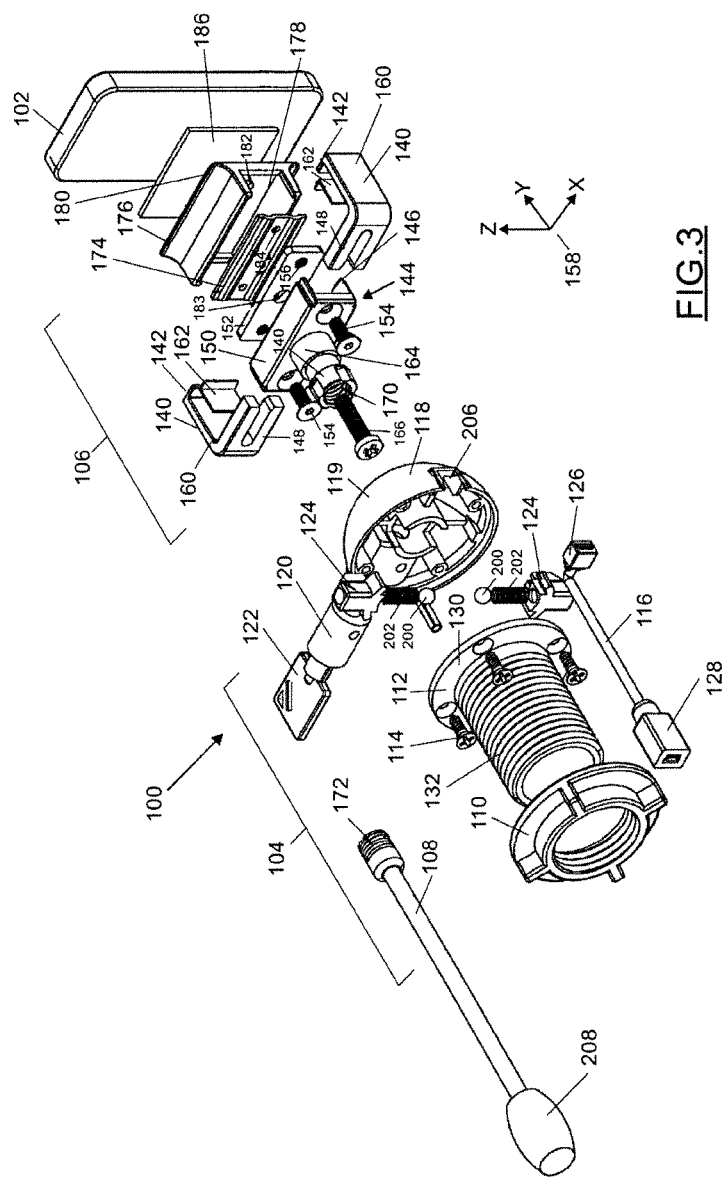
FIG. 3 is an exploded perspective view of the security system of FIGS. 1 and 2.

It is to be noted that numerous components are similar for different embodiments described herein, and components from one embodiment can be used on other embodiments. The description for similar components in different embodiments applies equally to all embodiments unless the context specifically requires otherwise. Components from one embodiment can be applied to other embodiments unless the context specifically requires otherwise, and specific reference to the cross-application of such components will not be made for each embodiment, but is expressly stated hereby.

Terms of orientation, such as top, bottom, front, rear, side, forward and rearward are used in the description. Terms of orientation are used for ease of understanding of the concepts being described. It is understood that in practice the structures described herein can take on alternate orientations.

FIGS. 1-5 illustrate an example embodiment of a security system 100 that can be used to secure an object 102 so that an individual such as a potential purchaser in a retail setting can view and interact with the object 102 but is generally prevented from removing the object 102 from its display location. By way of non-limiting example, the object 102 could be a rectangular prism shaped object such as a smart phone, tablet computer, GPS receiver, personal media player, personal gaming system or other electronic device or high value ware. As shown in FIGS. 1-5, the security system 100 includes an anchor assembly 104 and a movable mount assembly 106. Anchor assembly 104 is configured to be secured to a stationary support such as a display counter, and mount assembly 106 is configured to be secured to the object 102. In some embodiments, a tether 108 may be used to secure the mount assembly 106 to the anchor assembly 104.

As best seen in FIGS. 3-5, the anchor assembly 104 includes a cylindrical anchor member 112 that has a radial flange 130 at a forward end and from which a threaded tube 132 extends in a rearward direction. In use, the threaded tube 132 passes through a circular opening in a support member (such as a display counter), with the radial flange 112 resting on a surface of the support member. A threaded anchor plate or ring nut 110 can be screwed onto threaded tube 132 to engage the opposite surface of the support member to secure the cylindrical anchor member 112 in place. In at least one example embodiment, the anchor assembly 104 includes an anchor lock assembly 118 that releasably locks the mount assembly 106 to the anchor assembly 104. The anchor lock assembly 118 includes a rigid lock housing 119 that houses a lock device 120 that is actuated by a key 122 in the illustrated example.

Figure 3A:
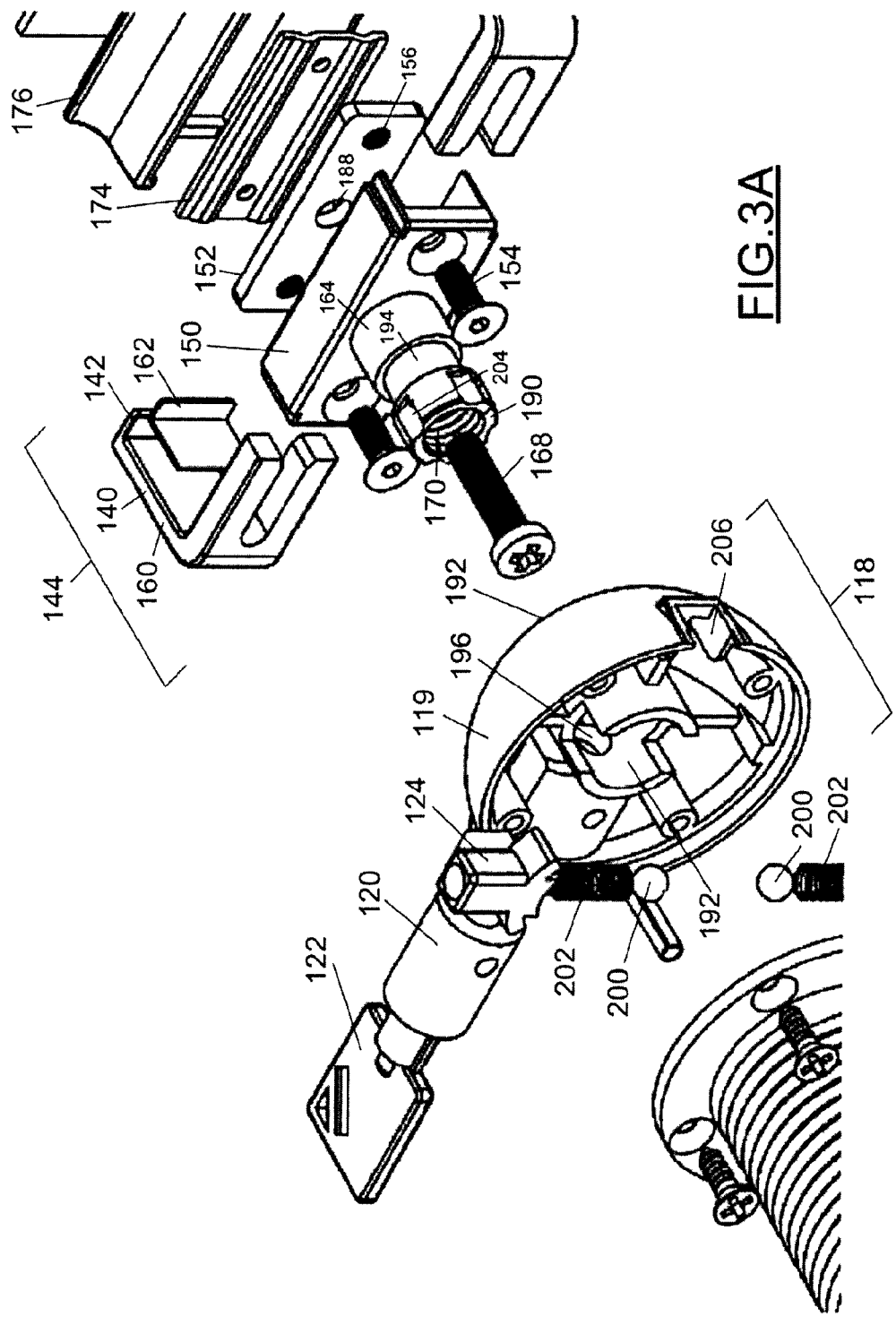
FIG. 3A is an enlarged view of part of FIG. 3.

The mount assembly 106 includes opposed generally L-shaped clamp members 140 that are configured to engage opposite side edges of the object 102 that is to be secured. Object clamp members 140 each have a respective arm or end 148 slidably received within a passage 146 defined within a clamp assembly 144. Although clamp assembly 144 can take a number of different configurations, in the example shown in FIGS. 1-5 the clamp assembly 144 includes a first clamp plate 152 and a base member 150, with the clamp passage 146 being defined between them. As best seen in FIGS. 3 and 3A, locking screws 154 pass through holes provided in the base member 150 and corresponding slots in the clamp member ends 148 into threaded holes 156 in the first clamp plate 152. In some embodiments, locking screws 154 are equipped with a security head so that a specialized tool is required to remove and tighten them. Tightening locking screws 154 draws the clamp plate 152 to the base member 150 to apply clamping force on the clamp member ends 148, thereby securing the clamp members 140 into opposition relative to each other. Thus, referring to Cartesian reference coordinates 158 in FIG. 3, clamp members 140 can be moved towards and away from each other along the y-axis to adjust the spacing between them and then they can be secured in place by tightening locking screws 154. In some embodiments, ribs or serrations may be provided on one or more of the interior surfaces of clamp passage 146 or clamp member arms 148 to provide resistance against separation of the clamp members 140 when screws 154 are tightened. Referring briefly to FIG. 8, in some example embodiments, ribs or serations 141 are provided on the top and bottom surfaces of the clamp member arms 148 to cooperate with corresponding ribs or serations 141 provided on the respective surfaces of clamp passage 146.

Referring again to FIGS. 3 and 3A, each clamp member 140 includes an inwardly directed engagement member 142, such as a flange or tab, that is connected by an intermediate side arm 160 in spaced opposition to clamp member arm 148. Engagement members 142 are used to clamp a surface of the object 102 as will be described in grater detail below. As shown in FIG. 3, a rubber or resilient anti-slip pad or anti-slip coating 162 may be applied to the inner surfaces of clamp member engagement member 142 and intermediate side arm 142. In an example embodiment, clamp members 140, clamp plate 152 and base member 150 are all formed from steel or other metal, however alternative materials could also be used. In the illustrated example, clamp passage 146 has a substantially rectangular cross-section that corresponds to a rectangular cross-section of the clamp member arms 158. Accordingly, when the arms 158 of the clamp members 140 are secured in place between the clamp plate 152 and the base member 150, movement of the clamp members 140 in each of X, Y and Z directions is prevented. Before screws 154 are tightened, the clamp assembly 144 functions to guide the clamp members 140 into the correct positioning, and once screws 154 are tightened, the clamp member arms 158 are clamped and contained in position, creating a parallel solid assembly.

The clamp assembly base member 150 also includes a central rearward protruding spigot or anchor interface 164 for engaging the anchor assembly 104. In the illustrated embodiment, the anchor interface 164 is cylindrical and defines a central passage for receiving an adjustment screw 168. Referring to FIG. 4, a threaded opening 166 is provided through the base member 150 within the anchor interface 164 for engaging the adjustment screw 168. Referring to FIGS. 3 and 3A, an opening 188 is provided through the clamp plate 152 for the adjustment screw 168, enabling the front end of the screw to press against a resilient spring plate 174 which in turn presses against, and spreads the force of screw 168 across, an object clamp member 176. Object clamp member 176 has a forward facing surface 180 for applying a clamping force against a back surface of the object 102 that is being secured. In an example embodiment, the object clamp member 176 defines a rearward opening channel 178 that slidably receives the clamp assembly 144 and spring plate 174. Mounting pins 182 are provided on a rearward surface of the object clamp member to cooperate with corresponding holes 184 on the spring plate 174 to secure the spring plate in place on the underside of the object clamp member. A resilient non-slip pad or non-slip coating 186 can be located on the clamp surface 180 of the object clamp 174 to help grip object 102. In some examples, object clamp member 176 may be formed from plastic, with spring plate 174 being formed from metal.

As seen in FIGS. 3 and 3A, the anchor interface 164 includes internal threads 170 at its rearwardly extending end 190 for receiving a threaded end 172 of the tether 108. Referring to the enlarged view of FIG. 3A and FIG. 4, anchor interface 164 is configured to be releasably received within a central, cylindrical opening 192 that is provided through the lock housing 119 of anchor lock assembly 118. In this regard, the anchor interface 164 defines a radial channel 194 located forward of enlarged end 190. When the anchor interface 164 is fully inserted into anchor lock assembly 118, the radial channel 194 aligns with a radial opening 196 that extends from cylindrical opening 192. Referring to FIG. 4, lock device 120 includes a retractable lock pin 198 which extends through radial opening 196 and into the radial channel 194 of anchor interface 164 when in an extended, locked position. Thus, when in the locked position, the extending end of lock pin 198 will engage the enlarged anchor interface end 190 to prevent the mount assembly 106 from being removed from the anchor lock assembly 118. Key 122 can be used to retract lock pin 198 from the radial channel 194 of anchor interface 164 to release the mount assembly 106 so it can be removed from the anchor lock assembly 118. In some embodiments, the lock pin 198 is chamfered and spring loaded into the extended position to allow the anchor interface 164 to be inserted and snapped into a locked position in the central opening 192 without requiring actuation of key 122, while withdrawal of the anchor interface 164 is prevented until key 122 is actuated to retract the lock pin 198.

In the illustrated embodiment the radial channel 194 allows the mount assembly 106 to rotate even when the lock pin 198 prevents its removal from the anchor lock assembly 118. In some example embodiments, the anchor lock assembly 118 includes an indexing mechanism for controlling rotation of the mount assembly 106. For example, as best seen in FIGS. 3A and 5, anchor lock assembly includes a pair of opposed spring loaded balls 200 that extend partially into central opening 192 to engage the enlarged end 190 of the mount assembly anchor interface 164. Radial index notches 204 are provided on the mount assembly anchor interface 164 for receiving the spring loaded balls 200, allowing the mount assembly 106 to snap into and out of biased positions as it rotates about the Z axis, with spring loaded balls 200 acting as cam followers and the notched radial outer surface of the enlarged end 190 acting as a cam. Such indexing may be used for example to facilitate rotation of mount assembly 106 ninety degrees between a "landscape" and "portrait" viewing positions for object 102. In one example, the balls 200 are each biased partially into central opening 192 by a respective spring 202 that is held in place within the lock housing 119 by a respective spring retaining member 124. In some example embodiments, one or more stop members 195 are located in radial channel 194 for cooperating with lock pin 198 on the anchor interface 164 in order to prevent the mount assembly 104 from being rotated beyond a threshold amount, thus protecting any power cord attachment to the mounted device. In one example embodiment, stop members 195 are positioned to prevent the mount assembly 104 from being rotated more than 180 degrees. In such an embodiment, the indexing could be used to allow the mount assembly 106 to "click" into a portrait position, be rotated 90 degrees counter-clockwise to "click" into a first landscape position, then be rotated 180 degrees clockwise to "click" into a second landscape position, with the stop members 195 preventing counter-clockwise rotation beyond the first landscape position and clockwise rotation beyond the second landscape position.

In one example, the anchor assembly 104 includes a power/data line 116 that extends internally within the cylindrical anchor member 112 and which has a connector 128 at one end for connecting to a power and/or data source and a further connector 126 at the other end 126 for connecting to a line to object 102. In the illustrated embodiment, lock housing 119 defines an external opening 206 that houses connector 126. Connectors 126, 128 could for example be mini-USB male or female plug style connectors. In at least one example, connector 126 is a female connector rigidly secured in place to the lock housing 119 such that a short power line can be connected from lock housing 119 to the object 102 to periodically charge the object 102 as required.

Figure 6:
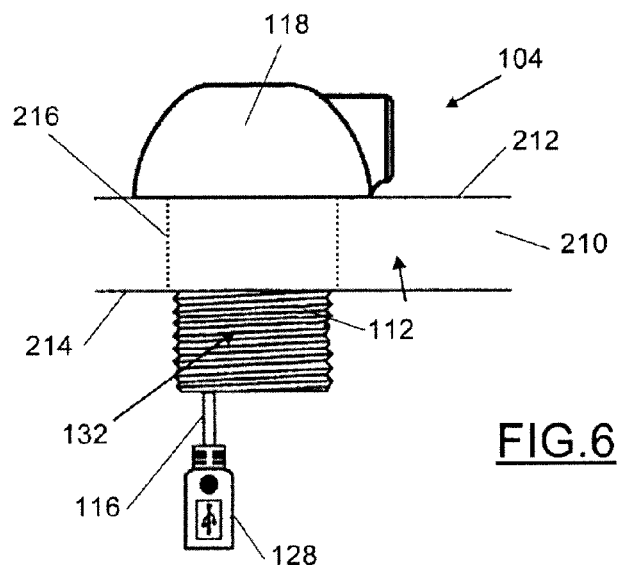
FIGS. 6 and 7 are side views illustrating attachment of the anchor assembly of the security system of FIG. 1 to a support member.
Figure 7:
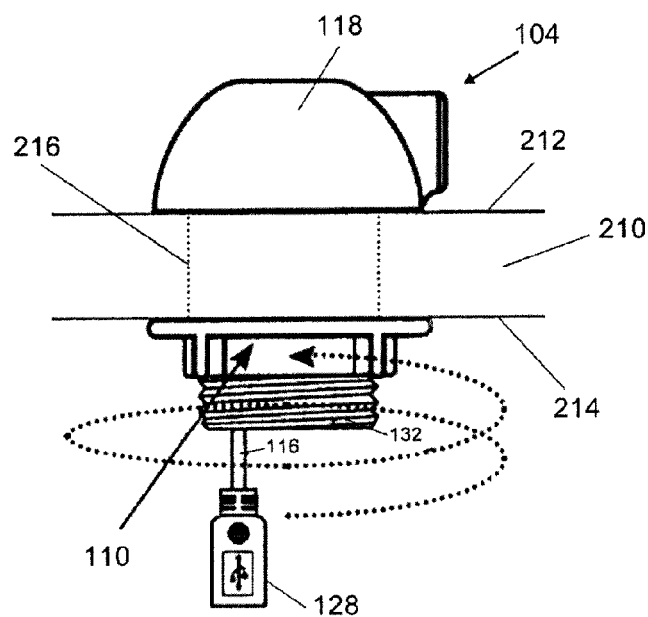

An overview of the components of the security system 100 having been provided, an example of the use of security system 100 to secure an object 102 will now be described with reference to FIGS. 1-15. The use of tether 108 with security system 100 is optional in at least some embodiments, and accordingly system 100 will first be described without the use of tether 108. An initial step involves assembling the anchor assembly 104 by securing the anchor lock assembly 118 to the cylindrical anchor member 112. Although the anchor lock assembly can take a number of alternative configurations, in the illustrated embodiment, the anchor lock assembly 118 is secured to the anchor member flange 130 by screws 114 which pass through corresponding openings in the flange 130 and into respective threaded holes in the lock housing 119. The assembled anchor assembly 104 can then be mounted to a support member 210 as illustrated in FIGS. 6 and 7 (also shown in dashed lines in FIG. 5). Support member 210 could for example be a display counter in a retail location and be configured to support multiple security systems 100 in tandem. An opening 216 is provided through the support member 210 that is larger than the circumference of the threaded region 132 of the cylindrical anchor member 112 but smaller than the flange 130, such that the threaded region 132 is inserted into the opening 216 until flange 130 engages a forward surface 212 of the support member 210. The anchor assembly 104 is then secured to the support member by screwing the threaded anchor plate 110 onto threaded tube 132 to engage the opposite surface 214 of the support member 210, a shown in FIG. 7. Once the anchor assembly 104 is secured to support member 210, access to the screws 114 that secure the lock assembly 118 is prevented.

Mount assembly 106 is secured to the object 102 in the following manner. As a first step, the mount assembly 106 is assembled so that the opposed clamp members 140 each have their respective arms 146 slidably received within the clamp assembly 144 (as shown in FIG. 8), with screws 154 (FIGS. 10, 11) attached to the first clamp plate 152 but not fully tightened. The object clamp member 176 is placed over the clap assembly 144 with spring plate 174 sandwiched between a back surface of the object clamp member 176 and a forward surface of the clamp assembly 144, with the forward surface 180 of the object clamp member 176 located rearward of the inwardly directed clamp engagement members 142 that are located at the front ends of opposed clamp members 140 members 140. (FIGS. 5 and 9). Screw 168 is inserted through the base member 150 of the clamp assembly 144 to apply a forward pressure on the object clamp member 176 through the spring plate 174 (FIGS. 10, 11). In some example embodiments, spring plate 174 is omitted and the screw 169 engages the clamp member 176 directly. In the illustrated embodiment, the object clamp member 176 is selected to have a width (i.e. distance that it extends between the opposed clamp members 140) that is generally close to the width of the object 102 that the mount assembly 106 is intended to secure. By way of non-limiting example, in the case where object 102 is a smart phone, the width of the clamp member 176 (and its supporting clamp assembly 144 may be at least 75% of the width of the smart phone, and in the case where the object 102 is a tablet, the width of the clamp member 176 (and its supporting clamp assembly 144 may be at least 75% of the width of the tablet. Thus, in at least some example embodiments, the clamp assembly is configured to extend across more than half the width of the object that it clamps against, which may reduce pressure applied at any single point on the object 102. In at least some example embodiments, the clamp assembly is configured to extend across more than 85% of the width of the object that it clamps against.

As the object clamp member 176 is slidably received in the z direction on the clamp assembly 144 with the back of the object clamp member 176 resting on the adjustment screw 168, prior to securing object 102, the object clamp member 176 has some freedom of movement to pivot about the x axis (and in some case the Y axis as well), allowing the object clamp member 176 to conform to the back of the object 102.

After the mount assembly 106 is assembled, the object 102 is positioned as shown in the FIG. 12 so that its back surface rests against the front surface 180 of object clamp member 176, and its side edges are located between opposed clamp members 140. Clamp members 140 are then pressed together in a direction parallel to the Y-axis to gently engage the opposite side edges of the object such that the clamp engagement members 142 located on the forward ends of opposed clamp members 140 each extend partially over the front surface of the object 102. In at least some example embodiments, the spacing between opposed clamp members 140 is adjusted by hand so as to provide direct feedback to the person applying force and avoid damage to the object 102. Locking screws 154 are then tightened to secure the opposed clamp 140 in position so they can not be separated.

Screw 168 is then tightened to push the object clamp member 176 forward in the Z-axis direction to engage the back of the object 102 and push the front of the object 102 into engagement with the clamp engagement members 142 of the opposed arms 140. Once the screw 168 is tightened, the resilient coating 162 on each clamp member 140 engages a respective front surface and side edge surface of the object 102, and the resilient surface 180 of the object clamp member 176 engages the back of the object 102 as best seen in FIGS. 12 and 12A. In an example embodiment, finger tightening of the screw 168 is sufficient to secure the object 102 to the mount assembly 106 such that the object 102 cannot be removed until one or more of the screws 154, 168 is loosened. Such a configuration requires relatively low clamping force to be applied to secure the object 102, thereby reducing the potential for damage to object 102. In some example embodiments a torque limited screw driver can be provided for use with screw 168 to prevent overtightening. The resilient coatings or pads 186, 162 enhance the frictional forces between the contact points of mount assembly 106 and the object 102 without requiring use of an adhesive contact surface with the object (although the use of an adhesive such as double sided tape on surface 180 is not precluded and may enhance the grip on the object in some applications).

In some example embodiments, resilient pad 186 takes the form of reclosable fastening tape (see FIG. 37), with one tape section 501 secured to surface 180 and a corresponding tape section 502 secured to the back of secured object 102. As known in the art, reclosable fastening tape can for example take the form of continuous strips of polyolefin stems with a mushroom shaped top protruding up from a backing, with the opposite side of the backing having a conformable acrylic foam adhesive. The polyolefin stems with mushroom shaped tops facing out from surface 180 engage the corresponding stems facing out from the lower surface of object 102 to prevent movement of the object 102 parallel to surface 180. In an example embodiment, in order to enhance the grip between the object 102 and surface 180, the tape strips used on the opposed surfaces have different stem patterns. For example, tape used on the surface 180 could be 3M™ SJ-3551 (which has straight rows of stems) and the tape used on the back of the object 102 could be 3M™ SJ-3540 (which has stems that extend in rows that are sinusoidal or wavy).

Figure 13:
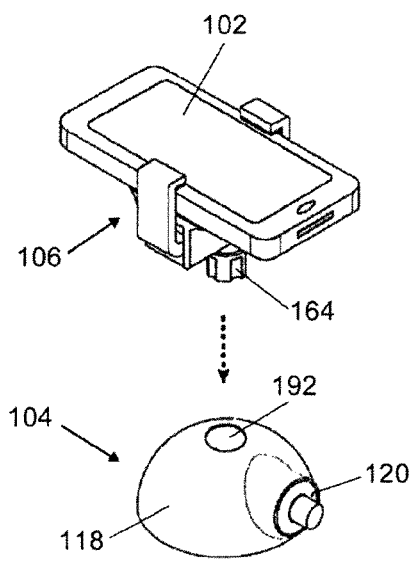
FIGS. 13 and 14 are perspective views illustrating mounting of the mount assembly to the anchor assembly of the security system of FIG. 1.
Figure 14:
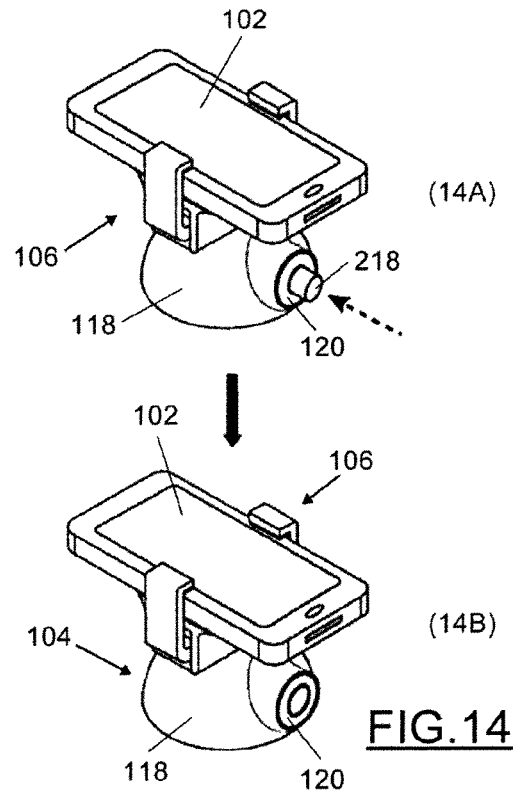
Figure 15:
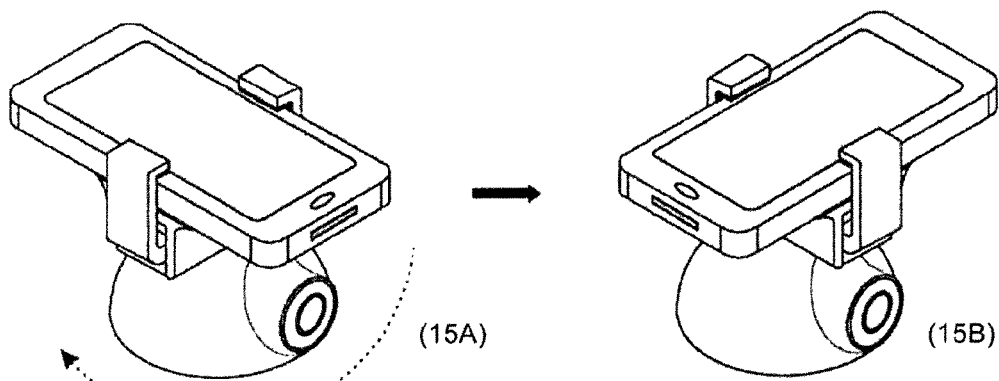
FIG. 15 are perspective views illustrating pivoting of the mount assembly relative to the anchor assembly of the security system of FIG. 1.

As shown in FIGS. 13 and 14, once the object 102 is secured to the mount assembly 106, the next step is to secure the mount assembly 106 to the lock assembly 118 of the anchor assembly 104. In FIG. 13, the lock device 120 of the lock assembly 118 has been placed in an unlocked state by key 122. The mount assembly 106 is secured to the base by inserting its cylindrical anchor interface 164 into the opening 192 of the lock assembly 106 as shown in FIG. 13, and then pushing in locking cylinder 218 as shown in 14(A) and 14(B) of FIG. 14. When the locking cylinder 218 is pushed in, lock pin 198 (FIG. 4) is received within the circumferential groove 194 of the cylindrical anchor interface 164, thereby preventing removal of the mount assembly 106 to the lock assembly 118 until the lock device 120 is subsequently released using key 122. As noted above, in an example embodiment the lock assembly 118 is provided with an indexing mechanism that includes spring loaded balls 200 that interact with grooves 170 (FIG. 5) in the cylindrical anchor interface 164 to provide indexed 90 degree pivoting of the mount assembly 106 and displayed object 102 as illustrated in 15A and 15B of FIG. 15.

As will be appreciated from the Figures and the above description, when the mount assembly 106 is secured to the anchor assembly 104, access to the object clamp member adjustment screw 168 is restricted as the screw can only be accessed from the back side of cylindrical anchor interface 164, which is locked within the lock assembly 118. Furthermore, the limited clearance between clamp screws 154 and the forward surface of the lock assembly 118 prevents access to the clamp screws 154. Accordingly, when the mount assembly 106 is secured to the anchor assembly 104, screws 168, 154 cannot be accessed to release the grip provided by the mount assembly 106 on the object 102.

When an interested person such as a customer desires a higher level of interaction with object 102, an authorized person can release the mount assembly 106 by unlocking lock device 120. As noted above, in some embodiments a tether 108 can optionally be used with the system 100. In particular, the tether 108 can provide a degree of security when the mount assembly is released from the lock assembly 118. In the illustrated embodiment, referring to FIGS. 3, 3A and 5, the tether can be used by inserting its threaded end 172 through the anchor assembly 104, and then screwing the treaded end into the threaded opening 170 that is provided at the back end of mount assembly anchor interface 164. Enlarged end 208 of the tether 108 then prevents removal of the tether 108 from the anchor assembly.

Figure 16:
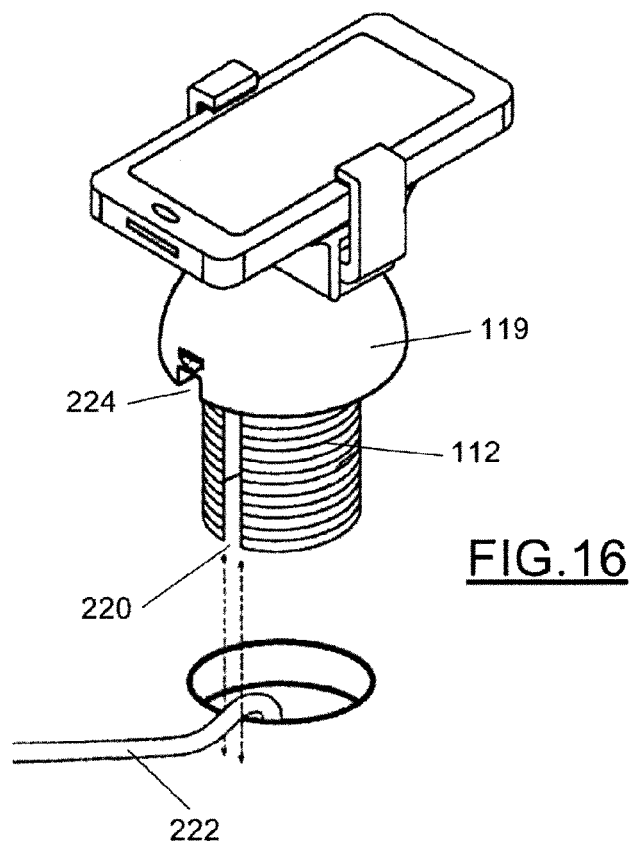
FIGS. 16 and 17 are perspective views illustrating a security system configured for use with a third party power supply cord, according to an example embodiment.
Figure 17:
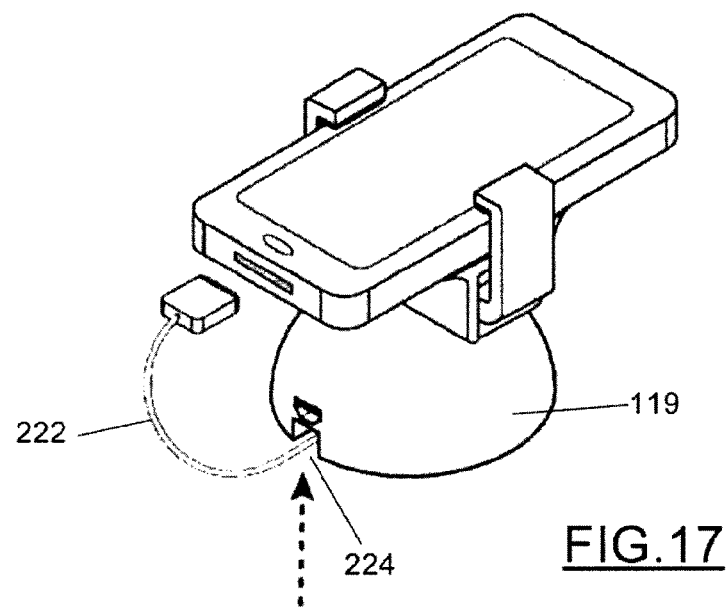

As noted above security system 100 can be provided with a power cable 116 that extends through the anchor member 112 and includes a connector 126 on the lock housing 119. In some embodiments, the system 100 may be configured to accommodate third party power cords, and in this regard FIGS. 16 and 17 illustrate an embodiment in which a cooperating slot 220 and notch 224 are provided on the cylindrical anchor member 112 and the lock housing 119 to accommodate a third party power cable 222 for connection to object 222.

FIG. 18 illustrates a security system 226 according to another example embodiment. Security system 226 is identical to system 100 except that clamp assembly 144 uses a single piece arm clamp component 230 in place of base member 150 and first clamp plate 152. Component 230 defines internal rectangular passage 146 for receiving and clamping the ends of opposed clamp members 140, and has a generally C-shaped cross-section such that a slot-like opening 228 is defined along the width of the clamp component 230. Slot opening 228 permits clamp screws 114 to be used to draw front and back plates 232, 234 of the component 230 together to clamp the ends of opposed clamp members 140.

Figure 20:
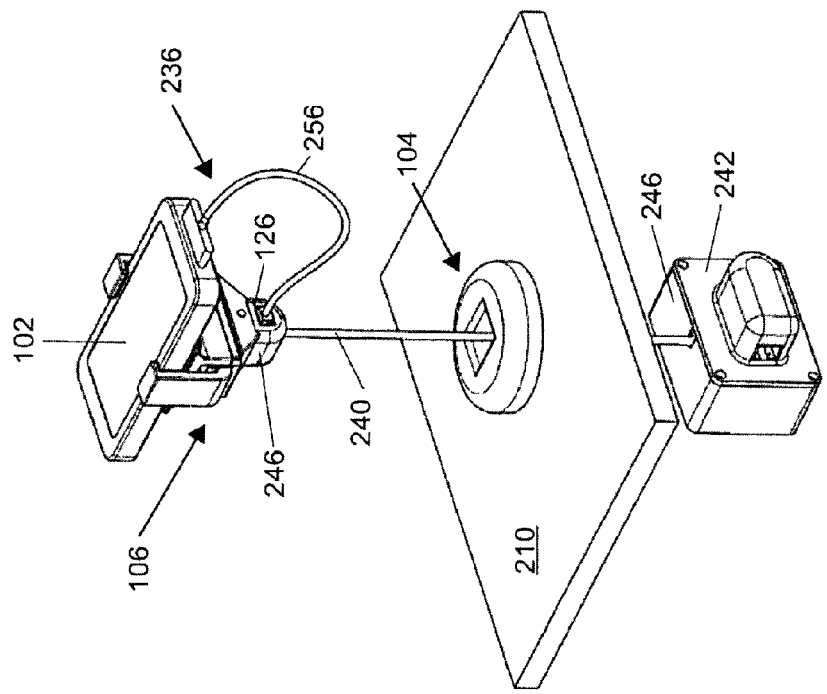
FIGS. 19 and 20 are perspective views of a further example embodiment of a security system in retracted and extended positions, respectively.
Figure 19:
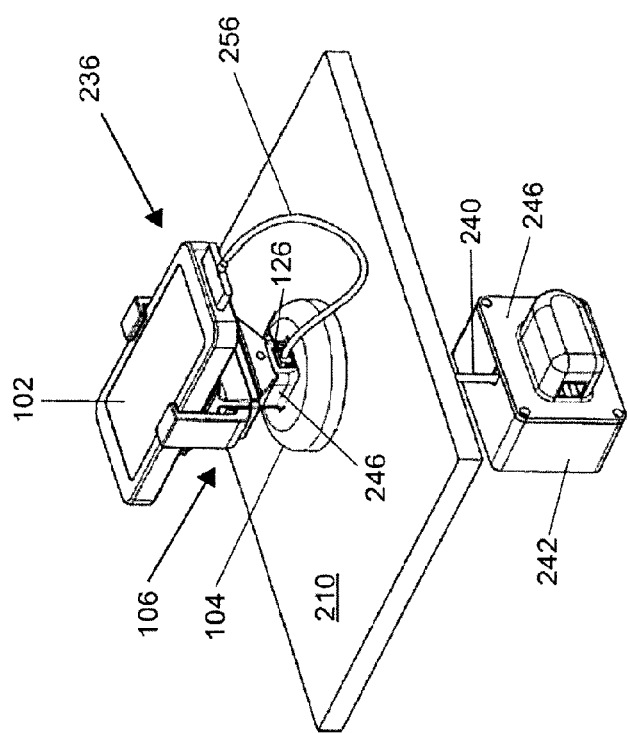
Figure 21:
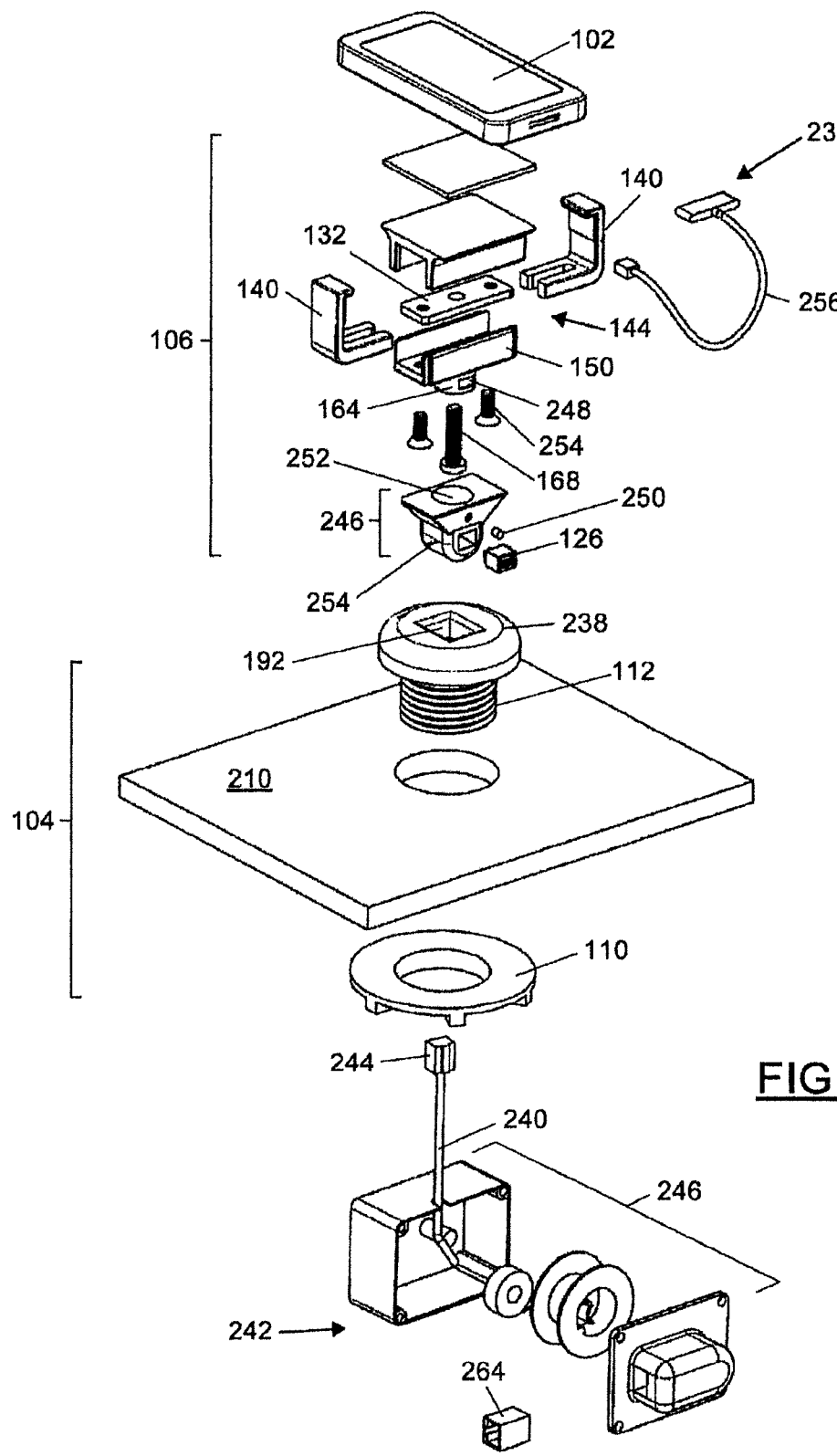
FIG. 21 is an exploded perspective view of the security system of FIGS. 19 and 20.
Figure 22:
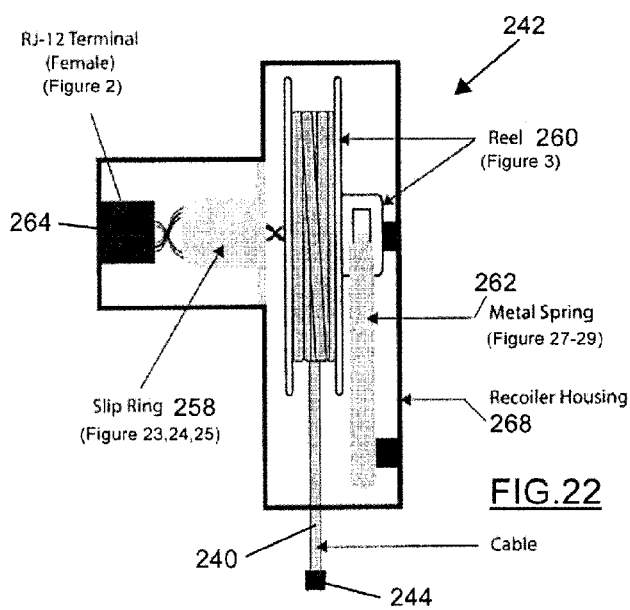
FIGS. 22 to 29 illustrate a recoiler for use with the security system of FIGS. 19 and 20.
Figure 23:
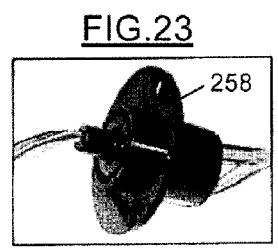
Figure 24:
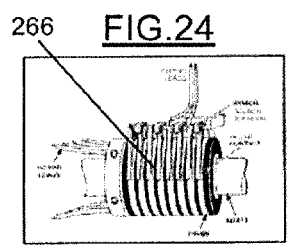
Figure 25:
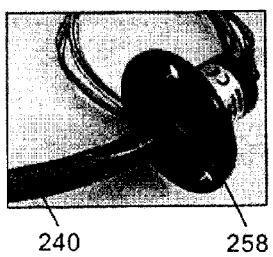
Figure 26:
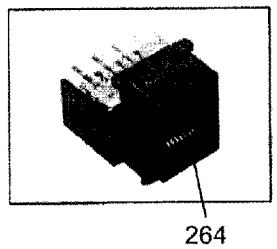
Figure 27:
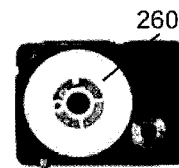
Figure 28:
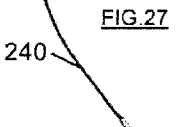
Figure 29:

FIGS. 19 to 21 illustrate a security system 236 according to another example embodiment for securing an object 102 to a support member 210. Security system 236 is identical to systems 100 and 226 with the exception of differences that will be apparent from the description and figures. FIGS. 19 and 20 show the security system 236 with its mount assembly 106 in retracted and extended positions respectively, and FIG. 21 shows an exploded view of the security system.

Unlike security systems 100 and 226, security system 236 does not include a locking assembly for rigidly locking the mount assembly, but uses a recoiling tether assembly 242 from which a powered tether cable 240 extends. As shown in the Figures, an extending end 244 of cable 240 is secured to the mount assembly 106, with the other end connected to recoiler 246, and a central region of the cable passing through the central opening 192 of anchor assembly 104. The mount assembly 106 includes a cable interface 246 secures the forward end 244 of cable 240 to the clamp assembly 144 of the mount assembly 106. In the illustrated embodiment, cable interface 246 includes a forward opening 252 that receives the protruding base interface 164 and is secured by a pin 250 that extends into a slot 248 on the anchor interface 164. The cable end 244 is secured within the cable interface 246 to secure the cable interface 246 to the recoiler assembly. In the illustrated embodiment, cable 240 houses internal conductors that are electrically connected to a plug interface 126 that is housed within the interface 246, such that an intermediate power cord can be connected between plug interface 126 and the object 102 at least to provide power thereto.

In an example embodiment, a back end 254 of the anchor interface and a forward end 238 of the anchor assembly 104 are complimentary shaped to maintain the object 102 in a desired display position as shown in FIG. 19 when the recoiler assembly has retracted cable 240. For example, the back end 254 could be configured to extend into anchor opening 192 and be engaged by the wall defining the anchor opening 192.

In an example embodiment, the recoiler assembly 242 is configured to supply power to the conductors of cable 240, and in this regard FIGS. 22 to 29 illustrate one possible configuration of a recoiler assembly 242 that includes, within housing 268, a slip ring 258 housing an stator/rotor assembly 266, an electrical terminal 264 connected to the stator of the slip ring 258, a reel 260 for cable 240, and a spring 262 biasing the reel 260 to recoil the cable 240.

Figure 30:
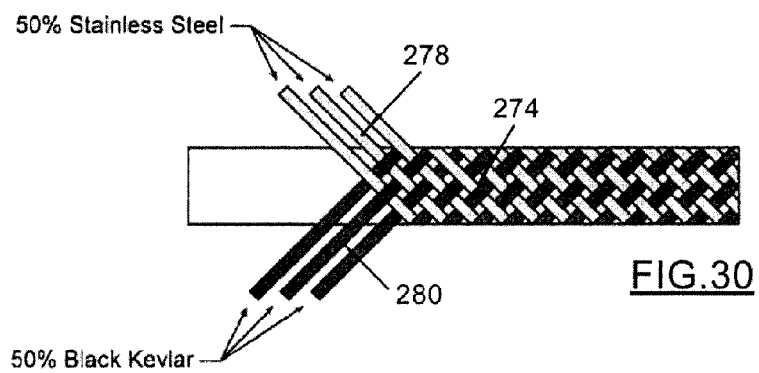
FIGS. 30 and 31 illustrate a powered cable for use with the recoiler of the security system of FIGS. 19 and 20.
Figure 31:
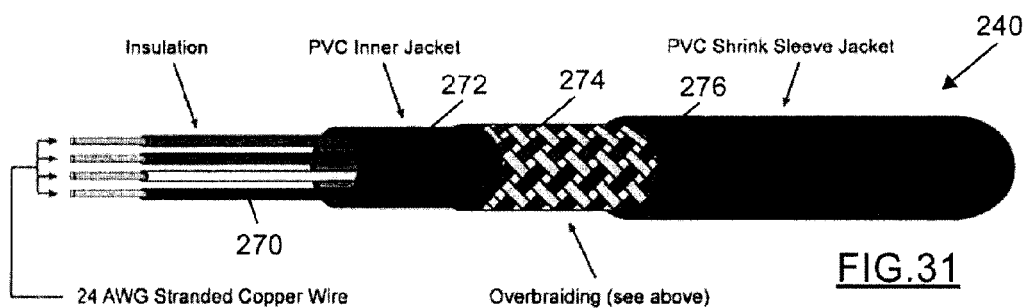

In at least one example embodiment, the cable 240 is a cut resistant cable. By way of example, FIGS. 30 and 31 illustrate and embodiment in which cable 240 includes the following: an inner core 270 including CAT 3 UTP (4 conductors), 24 AWG stranded copper wire with a soft PVC jacket 272; overbraiding 274 made of 50% steel 278 and 50% Kevlar 280; and an outer jacket 276 formed from PCV shrink sleeve. The combination of both steel and Kevlar may provide the enhanced cut resistance in some configurations. Although either material alone is easily compromised (steel by wire cutters; Kevlar by scissors or a razor blade), when combined using an overbraiding technique (weaving fine strands of both materials together in a 1:1 ratio) they become extremely difficult to cut, and requires the use of at least 2 different tools. Additionally, the stranded steel (as opposed to solid core steel cable) has a tendency to loosen and mushroom when compressed (ie: by wire cutters), making it even more difficult to cut in a short amount of time.

In some embodiments, the material ratios could be different than 50% each; in some embodiments a cut proof para-aramid synthetic fiber other than Kevlar could be used.

The recoiler assembly 242 can also be adapted for used in systems 100 and 226.

The security systems described herein keeps the object 102 intact—the back of the device cannot be separated when it is clamped in the security system.

In example embodiments, the security system 100 offers modular versatility in that different types of anchor configurations can be interchangeably used with anchor lock assembly 118. In this regard, FIGS. 31-33 illustrate a security system that is identical to that of FIGS. 1 and 2, except cylindrical anchor member 112 has been replaced with anchor member 300. Anchor member 300 includes a first plate member 302 that has fastening holes 310 extending therethrough to accommodate screws 114 for securing the first plate member 302 to the anchor lock assembly 118. First plate member 302 defines a central opening 312 that communicates with a radial slot 314 such that a power cable can pass through the center of plate 302. The plate 302 also includes a pair of threaded standoffs 308. The anchor member 300 includes a back plate 304 that also defines a circular power cable opening 320 that communicates with a radial slot 306. Holes 322 are provided in back plate 304 for receiving securing bolts 317, 318 that can be threaded into standoffs 308. In use, the anchor member 300 can be used to mount the security device to a display structure having a slot that extends between front and back surfaces. In particular, standoffs 308 can be inserted into the slot until first plate 302 rests against the front surface. Back plate 304 is then secured to the back surface by passing screws 317, 318 through holes 322 and into the standoffs 308. The anchor assembly 106 can then be slid along the slot and secured in a desired position on the display structure by tightening bolts 317, 318 to tightly engage the display structure between plates 302 and 304.

FIG. 36 illustrates a security system that is identical to that of FIGS. 1 and 2, except cylindrical anchor member 112 has been replaced with anchor member 400. Anchor member 400 includes a circular plate 402 for securing to lock assembly 118 with screws 114. A tubular shaft 404 extends from the plate 402, and a front flange 406 is secured on shaft 404 for engaging the front surface of a display structure. A back plate 408 is slidably mounted on the shaft 404 and includes a cylindrical clamp 410 with a tightening mechanism 412 so that the back plate can be secured at various locations along the shaft 404. In use, the anchor member 404 can be used to mount the security device to a display structure having an opening therethrough that extends between front and back surfaces. In particular, shaft 404 can be inserted into the hole until flange 406 rests against the front surface. Back plate 408 is then slid onto the shaft 404 until it comes into contact with the back surface, at which point it can be secured in place by clamp 410. Screw holes 414 can provide a further security feature. In some embodiments, a bolt or pin 416 can be provided through a lower end of the shaft 404 to provide a further barrier against removal of the shaft 404 from the front of the display structure.

Figure 38:
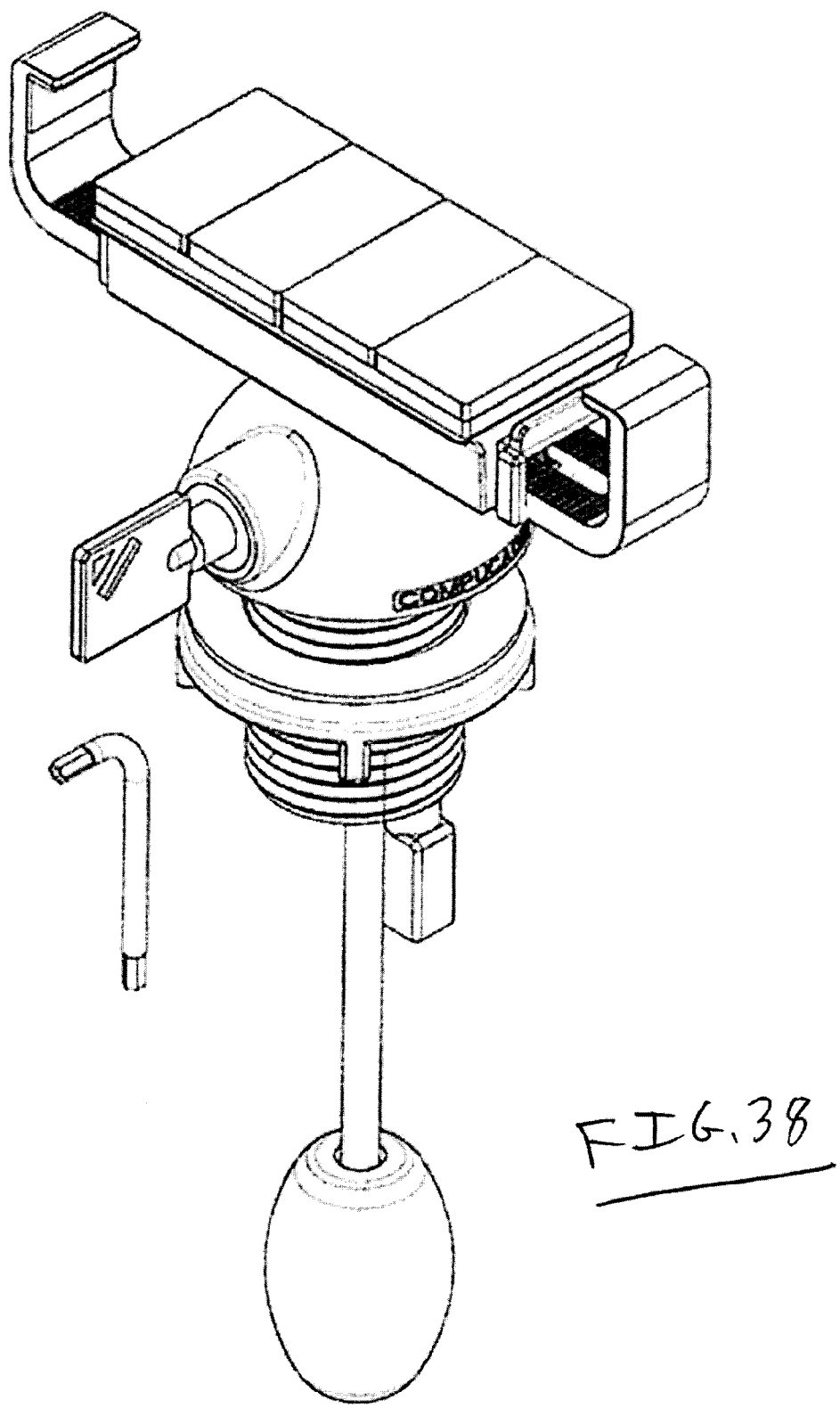
FIG. 38 is a perspective view of the security system of FIG. 37.

In example embodiments, the clamp assembly 104 can be varied and/or components within the clamp assembly 104 varied to provide further versatility to the security system. In this regard, FIGS. 37 and 38 show a further example of a security system that is similar to the system of FIGS. 1-17, but includes modifications to the clamp assembly 144 of mount assembly 106 to accommodate larger width objects 102. In this regard, the clamp assembly 144 of FIGS. 37 and 38 includes a longer clamp plate 152 and base member 150. A pair of locking screws 154 pass through holes provided in each end of the base member 150 and corresponding slots in the clamp member ends 148 into threaded hole pairs 156 in the first clamp plate 152. In some embodiments, locking screws 154 are equipped with a security head so that a specialized tool is required to remove and tighten them. Ribs or serrations 141 are provided on the top and bottom surfaces of the clamp member arms 148 to cooperate with corresponding ribs or serrations 141 provided on the respective surfaces of clamp passage 146.

In the example of FIG. 37, the clamp plate 142 has wings or upturned ends 504 to mitigate against a screwdriver attack on the security system. Furthermore, a locating ring 512 is provided on the back of resilient spring plate 174 to receive and guide the end of screw 168, and also prevent lateral movement of the spring plate 174. Additionally, in the example of FIG. 37, security plates 506 are secured by screws 508 to the back of the base member 150. The plates 506 cover and protect screws 154. Screws 508 are positioned to be blocked by the anchor assembly when the security system is engaged.

Figures 35A, 35B:
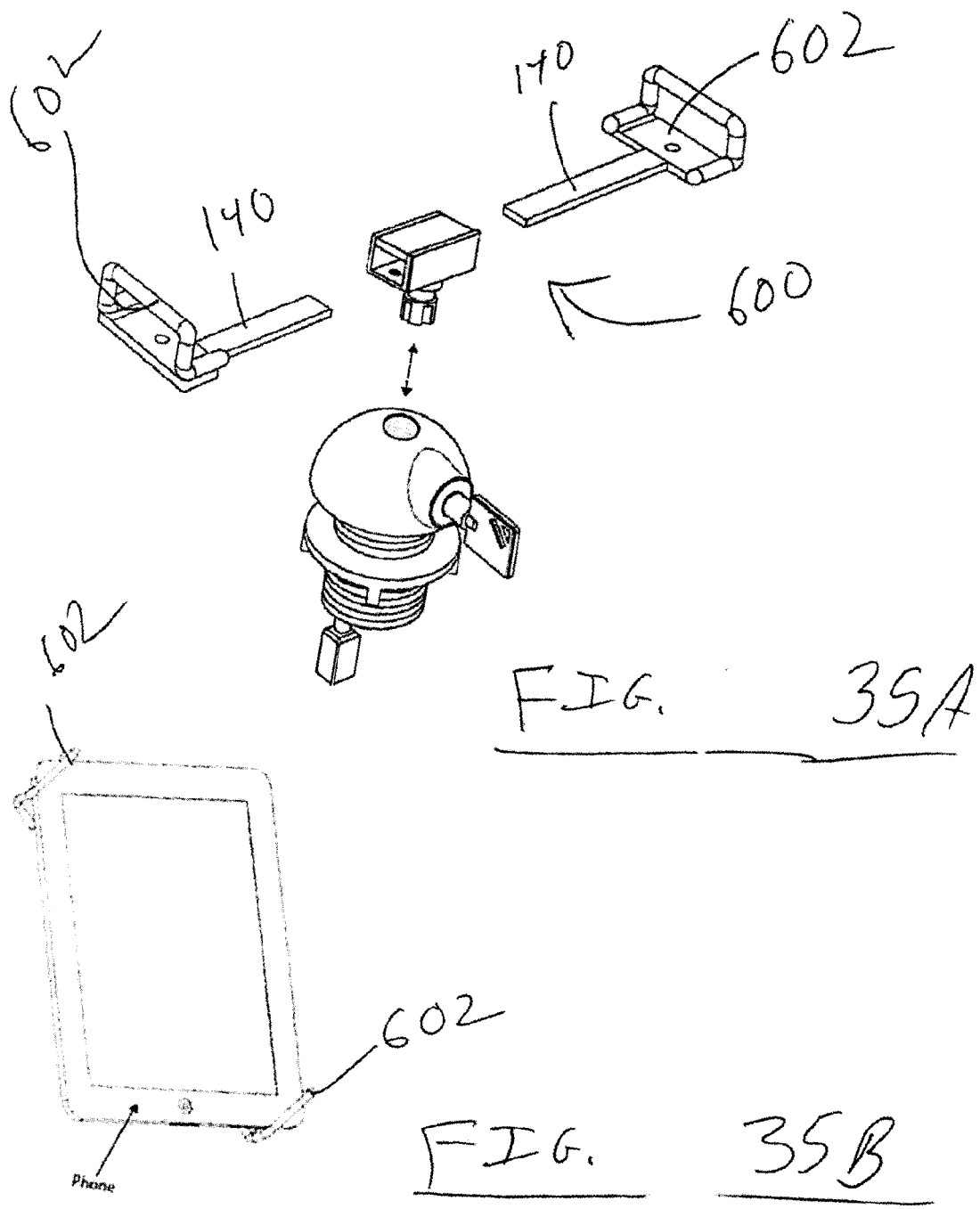
FIG. 35A is an exploded partial perspective view of a security system according to another example embodiment.
FIG. 35B is a perspective view of the security system of FIG. 35A.
Figure 39:
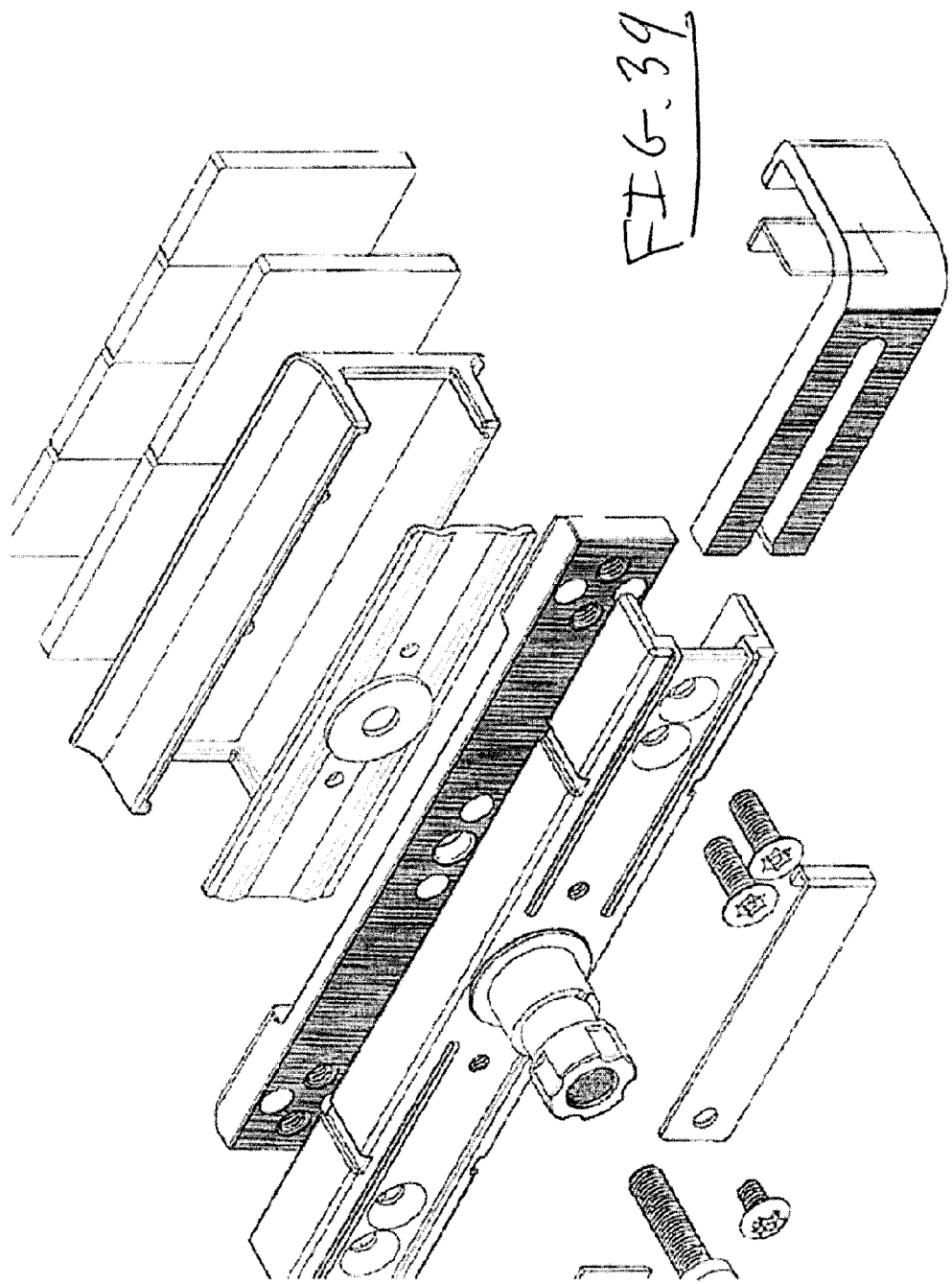
FIG. 39 is an exploded partial perspective view of a security system according to another example embodiment.
Figure 40:
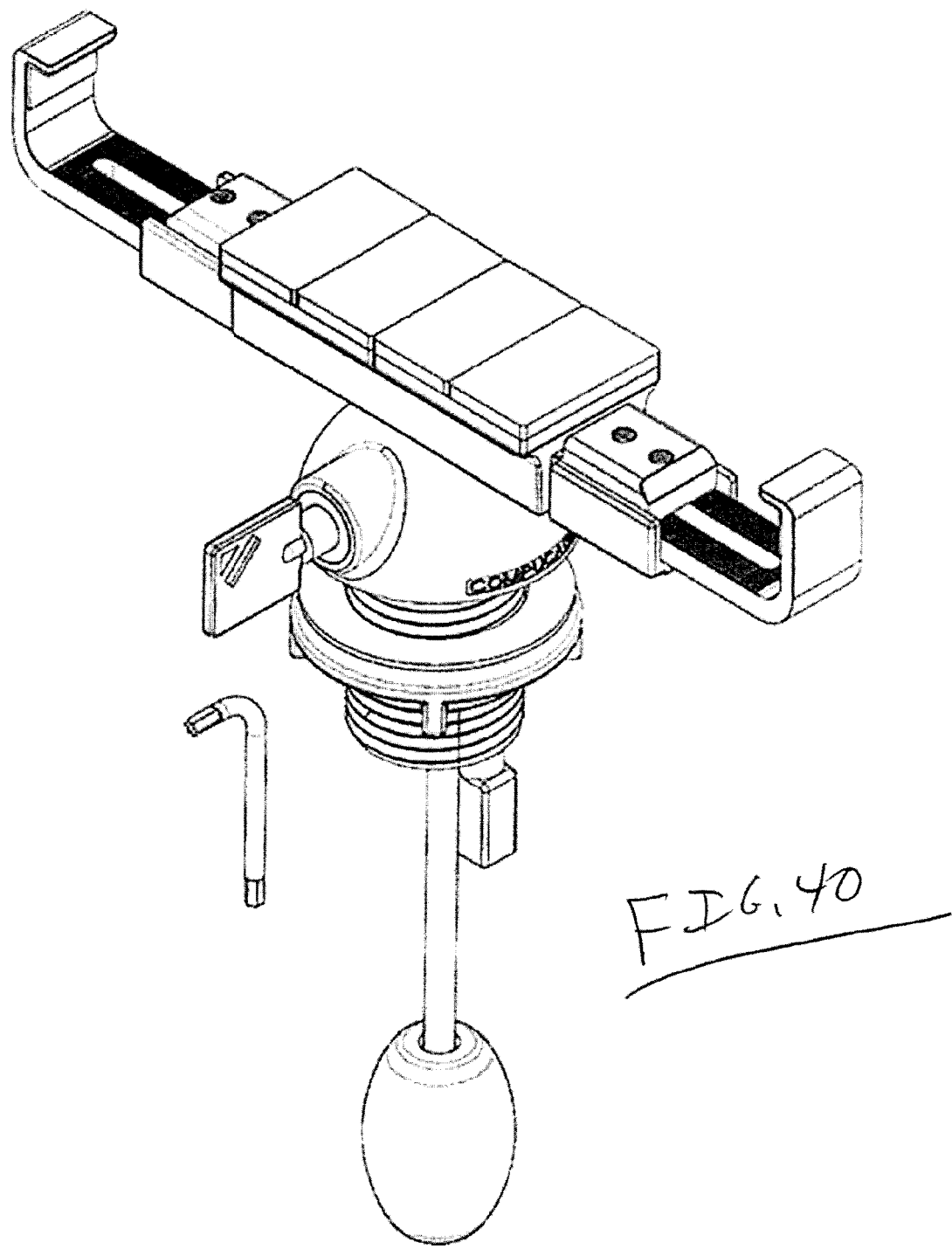
FIG. 40 is a perspective view of the security system of FIG. 39.

FIGS. 39 and 40 illustrate a further example of a clamp assembly that is similar to that shown in FIGS. 37 and 38, but which extends even wider. FIGS. 35A and 35B show another embodiment of a mount assembly 600 for use with the security system 100. The embodiment of FIGS. 35A and 35B is similar to previously described embodiments except that opposed clamp members 140 include rectangular rings 602 at the ends thereof. The rings 602 can be used to simultaneously engage diagonal corners of object 102.

The various embodiments presented above are merely examples and are in no way meant to limit the scope of this disclosure. Variations of the innovations described herein will be apparent to persons of ordinary skill in the art, such variations being within the intended scope of the present description. In particular, features from one or more of the above-described embodiments may be selected to create alternative embodiments comprised of a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

The invention claimed is:

1. A mount assembly for securing to an object that has front and back surfaces, comprising:
   opposed clamp members having engagement members for engaging the front surface of the object, and
   a clamp assembly for releasably securing the clamp members, the clamp assembly including opposed surfaces defining at least one passage for receiving ends of the opposed clamp members, the opposed surfaces being movable to each other to secure the clamp members,
   an adjustable object clamp member located on the clamp assembly and having a forward facing surface for applying a force against the back surface of the object, the object clamp member being adjustable when the object is located between the engagement members and the object clamp member enabling the object to be clamped between the engagement members and the object clamp member, wherein the object clamp member defines a rearwardly opening channel that slidably receives the clamp assembly.

2. The mount assembly of claim 1 wherein the opposed clamp member ends each comprise an arm slidably received within the passage defined by the clamp assembly, the clamp assembly including a first clamp plate and a base member with the passage being defined between them.

3. The mount assembly of claim 2 wherein locking screws pass through holes provided in the base member and corresponding slots in the clamp member ends into threaded holes in the first clamp plate.

4. The mount assembly of claim 2 wherein ribs or serrations are provided on surfaces of the clamp member arms to cooperate with corresponding ribs or serrations provided on respective surfaces that define the clamp passage.

5. The mount assembly of claim 2 wherein each clamp member comprises a distal end including the engagement member connected by an intermediate side arm in spaced opposition to the clamp member arm, the distal ends being configured to engage opposite side edges or diagonal corners of the object.

6. A security system including an anchor assembly, and a mount assembly according to claim 1, the anchor assembly being configured to be secured to a stationary support, the mount assembly being configured to be releasably secured to the anchor assembly wherein the anchor assembly comprises a power connector for connecting a power supply cord to the object.

7. The security system of claim 6 wherein the mount assembly can be rotated between indexed positions on the anchor assembly.

8. The mount assembly of claim 1 wherein the at least one passage defined by the clamp assembly encloses four sides of each of the received ends of the clamp members.

9. The mount assembly of claim 1, wherein the object clamp member is formed from plastic and a metal spring plate.

10. A security system for securing an object that has front and back surfaces, the security system comprising:
    an anchor assembly configured to be secured to a stationary support and comprising a power connector for connecting a power supply cord to the object; and
    a mount assembly for securing to the object, comprising:
    opposed clamp members having engagement members for engaging the front surface to the object,
    a clamp assembly for releasably securing the clamp members, the clamp assembly including opposed surfaces defining at least one passage for receiving ends of the opposed clamp members, the opposed surfaces being moveable to each other to secure the clamp members, and
    an adjustable object clamp member located on the clamp assembly and having a forward facing surface for applying a force against the back surface of the object, the object clamp member being adjustable when the object is located between the engagement members and the object clamp member enabling the object to be clamped between the engagement members and the object clamp member;

wherein when the mount assembly is locked to the anchor assembly the object cannot be released from the mount assembly.

11. The system of claim 10 wherein the anchor assembly comprises a releasable lock assembly configured to lock the mount assembly to the anchor assembly in a locked position that allows pivoting of the anchor assembly relative to the mount assembly but prevents separation of the mount assembly from the anchor assembly.

12. A security system for securing an object that has front and back surfaces, the security system comprising:
- an anchor assembly configured to be secured to a stationary support and comprising a power connector for connecting a power supply cord to the object; and
- a mount assembly for securing to the object, comprising:
  - opposed clamp members having engagement members for engaging the front surface to the object,
  - a clamp assembly for releasably securing the clamp members, the clamp assembly including opposed surfaces defining at least one passage for receiving ends of the opposed clamp members, the opposed surfaces being moveable to each other to secure the clamp members,
  - an adjustable object clamp member located on the clamp assembly and having a forward facing surface for applying a force against the back surface of the object, the object clamp member being adjustable when the object is located between the engagement members and the object clamp member enabling the object to be clamped between the engagement members and the object clamp member, and
  - a spigot that extends rearward of the clamp assembly, the spigot comprising a central opening housing an adjustment screw for adjusting the adjustable object clamp member, and wherein the anchor assembly is configured to releasably engage the spigot to secure the mount assembly, wherein the adjustment screw is accessible for adjustment when: the object is engaged by the opposed clamp members and the spigot is not engaged by the anchor assembly; and adjustment of the adjustment screw is prevented when the spigot is engaged by the anchor assembly.

13. The security system of claim 12 further comprising a tether having a first end connected to the spigot and an enlarged second end, the tether extending through the anchor assembly to secure the mount assembly to the anchor assembly.

* * * * *